United States Patent [19]

Harigane et al.

[11] Patent Number: 4,520,557
[45] Date of Patent: Jun. 4, 1985

[54] APPARATUS FOR MOUNTING CHIP TYPE CIRCUIT ELEMENTS ON PRINTED CIRCUIT BOARDS

[75] Inventors: Kotaro Harigane; Shuichi Tando; Kenichi Takahashi; Hirokazu Shudo, all of Tokyo, Japan

[73] Assignee: TDK Corporation, Japan

[21] Appl. No.: 409,184

[22] Filed: Aug. 18, 1982

[30] Foreign Application Priority Data

| Aug. 24, 1981 | [JP] | Japan | 56-131548 |
| Aug. 25, 1981 | [JP] | Japan | 56-124803[U] |
| Aug. 25, 1981 | [JP] | Japan | 56-124804[U] |
| Aug. 31, 1981 | [JP] | Japan | 56-127914[U] |
| Aug. 31, 1981 | [JP] | Japan | 56-127915[U] |
| Sep. 11, 1981 | [JP] | Japan | 56-135406[U] |
| Sep. 11, 1981 | [JP] | Japan | 56-135407[U] |
| Sep. 11, 1981 | [JP] | Japan | 56-135408[U] |
| Sep. 16, 1981 | [JP] | Japan | 56-136367[U] |
| Sep. 26, 1981 | [JP] | Japan | 56-141989[U] |
| Oct. 9, 1981 | [JP] | Japan | 56-150828 |
| Oct. 9, 1981 | [JP] | Japan | 56-150829[U] |

[51] Int. Cl.³ .................................................. H05K 3/30
[52] U.S. Cl. .................................... 29/740; 29/759; 29/840
[58] Field of Search .......... 29/740, 741, 840, 837–839, 29/739, 759

[56] References Cited

U.S. PATENT DOCUMENTS

| 4,274,196 | 6/1981 | Lemmer | 29/741 |
| 4,283,836 | 8/1981 | Janisiewicz et al. | 29/741 X |
| 4,372,802 | 2/1983 | Harigane et al. | 29/740 X |

Primary Examiner—Carl E. Hall
Attorney, Agent, or Firm—Steinberg & Raskin

[57] ABSTRACT

Apparatus for mounting chip type circuit elements on printed circuit boards in one-by-one fashion with increased speed and precision includes a supply unit adapted to supply chip type circuit elements, a plurality of pallets conveyed in an intermittent fashion, a first shifting member adapted to shift the chip type circuit elements from the supply unit onto the pallet, an X-Y table adapted to support a printed circuit board, a mounting mechanism having mounting heads associated therewith for mounting the chip type circuit elements on the printed circuit board supported by the X-Y table and a second shifting member adapted to shift the chip type circuit elements from the pallet to the mounting heads where they are received and positively gripped for subsequent mounting onto the printed circuit board.

17 Claims, 34 Drawing Figures

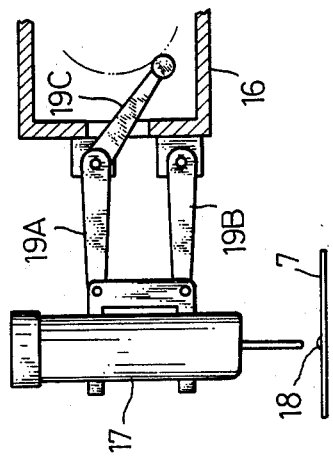
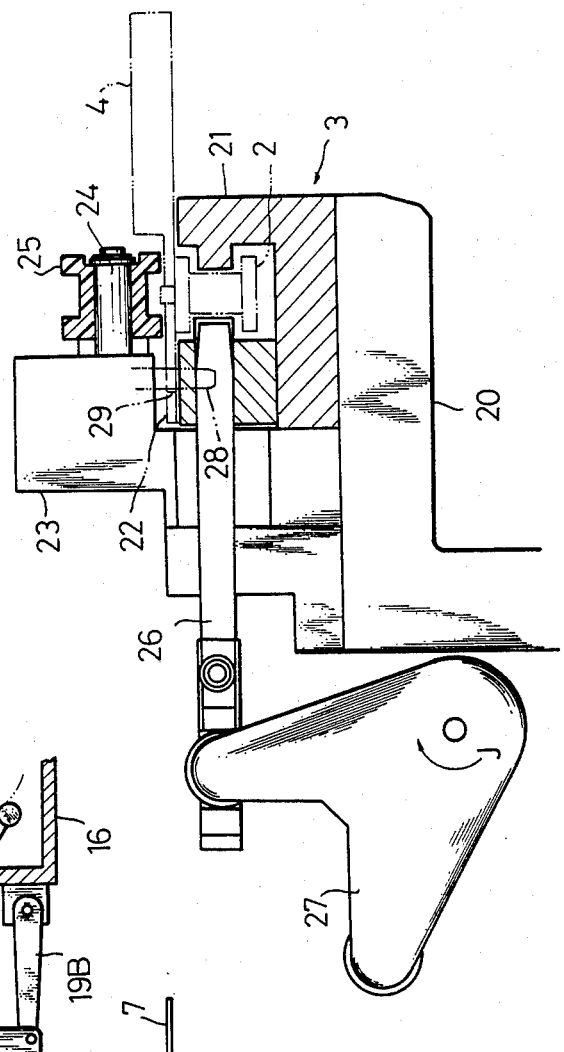

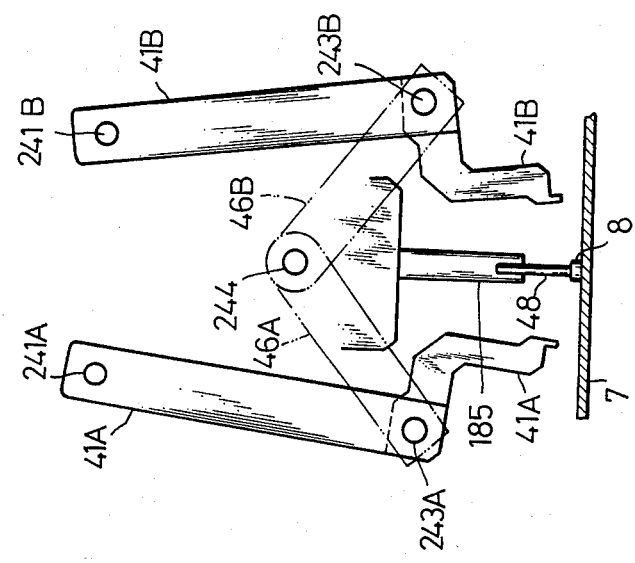
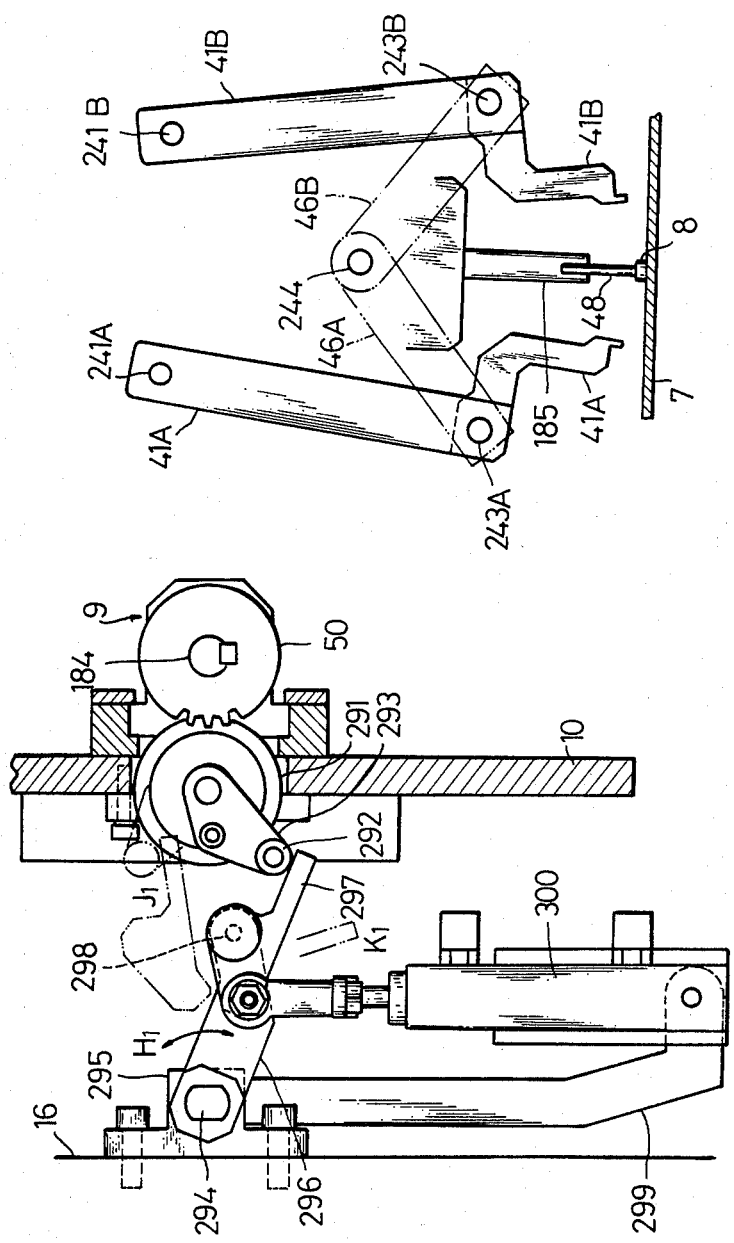
FIG. 26
FIG. 25

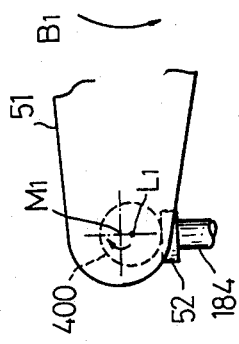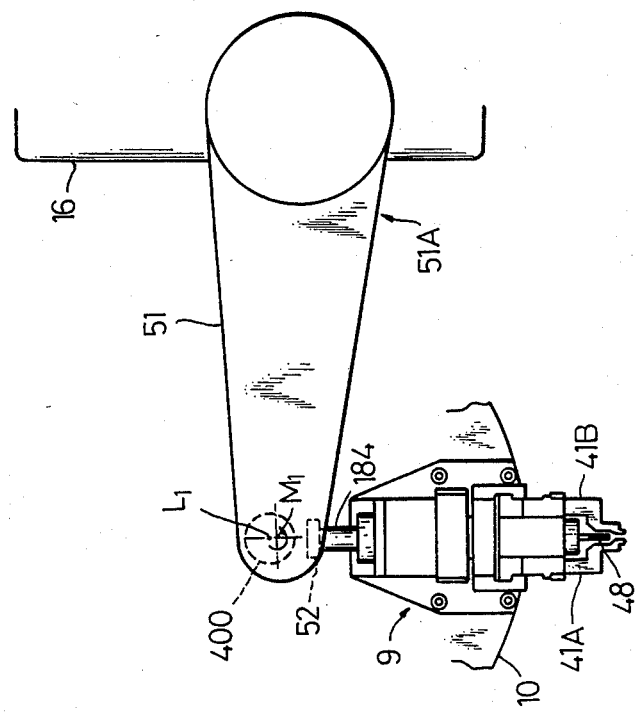

APPARATUS FOR MOUNTING CHIP TYPE CIRCUIT ELEMENTS ON PRINTED CIRCUIT BOARDS

BACKGROUND OF THE INVENTION

This invention relates generally to an apparatus for mounting chip type circuit elements on a printed circuit board and, in particular, to an apparatus for mounting chip type circuit elements which do not have lead wires associated therewith on a printed circuit board in a serial or one-by-one fashion.

U.S. Pat. No. 4,292,116 issued Sept. 29, 1981, assigned to the same assignee as the instant application, discloses an apparatus for mounting chip type circuit elements on a printed circuit board. Such apparatus includes a suction plate adapted to pick up and hold a multiplicity of chip type circuit elements and convey the same to a printed circuit board on which they are to be mounted.

Such mounting apparatus which incorporates the suction plate described above has a disadvantage in that it is difficult to utilize the same when it is desired to mount the chip type circuit elements after electronic elements having lead wires are inserted into the printed circuit board.

U.S. patent application Ser. No. 266,109, filed May 21, 1981, assigned to the same assignee as the instant application, discloses an apparatus for mounting chip type circuit elements on a printed circuit board in one-by-one fashion. Such apparatus includes a supply unit adapted to supply chip type circuit elements, a plurality of pallets adapted to be conveyed in an intermittent fashion in a longitudinal direction, sequence heads adapted to shift the circuit elements onto the pallet, an X-Y table adapted to support a printed circuit board, a mounting mechanism having mounting heads associated therewith for mounting the chip type circuit elements on the printed circuit board supported by the X-Y table and a shifting head for picking up the chip type circuit elements from the pallets and delivering the same to the mounting heads of the mounting mechanism. The pallets which are adapted to carry the chip type circuit elements include an adhesive mat which forms the surface for carrying the chip type circuit elements. The sequence head, mounting head and the shifting head each utilizes only suction force for holding the chip type circuit element.

Such mounting apparatus which incorporates the pallets described above has a disadvantage in that it is difficult to reliably prevent positional deviations of the chip type circuit elements or rotation of the same during operation, especially during high-speed transference.

Further, in apparatus for shifting and mounting chip type circuit elements on a printed circuit board which utilizes only suctioning of the circuit element, it is not uncommon for the circuit element to deviate from its desired position. Where such positional deviations are unduly large, the electrodes of the circuit element may be spaced by an undesirable amount from the conductor pattern printed on the circuit board resulting in various problems such as failure of connections.

SUMMARY OF THE INVENTION

Accordingly, one object of the invention is to provide a new and improved apparatus for mounting chip type circuit elements on printed circuit boards in one-by-one fashion, wherein the mounting speed is increased and the precision of the mounting position of the circuit element on the printed circuit board is enhanced by providing a construction wherein the chip type circuit elements are transferred while the same are gripped.

Another object of the invention is to provide a new and improved apparatus for mounting chip type circuit elements on printed circuit boards in a reliable fashion even after other electronic components have been inserted in the printed circuit board.

Still another object of the present invention is to provide a new and improved suction head for gripping and accurately positioning the chip type circuit elements.

A further object of the present invention is to provide a new and improved pallet for use with apparatus for mounting chip type circuit elements on printed circuit boards, the pallet being capable of conveying such circuit elements at high speed in a manner such that any deviation or rotation of the circuit elements from their desired positions is avoided.

Briefly, in accordance with the present invention, these and other objects are attained by providing apparatus including a supply unit adapted to supply chip type circuit elements, a plurality of pallets adapted to be conveyed in an intermittent fashion in a longitudinal direction, a first shifting member adapted to shift the chip type circuit elements from the supply unit onto the pallets, an X-Y table adapted to support a printed circuit board, a mounting mechanism having mounting heads associated therewith for mounting the chip type circuit elements on the printed circuit board supported by the X-Y table and a second shifting member adapted to shift the chip type circuit elements from the pallets to the mounting heads, wherein the pallets include circuit element grip members for mechanically receiving and gripping the chip type circuit element and wherein the mounting head includes a circuit element grip member for mechanically receiving and gripping the chip type circuit element, so that the chip type circuit element supplied from the supply unit is materially gripped mechanically until it is mounted onto the printed circuit board.

DESCRIPTION OF THE DRAWINGS

A more complete appreciation of the present invention and many of the attendant advantages thereof will be readily understood by reference to the following detailed description when considered in connection with the accompanying drawings in which:

FIG. 3 is a side elevational view taken partly in section of an adhesive dispenser utilized in combination with the present invention;

FIG. 4 is a sectional view of a chain conveyor to which pallets are to be attached;

FIG. 25 is a side elevational view showing a mounting direction conversion mechanism;

FIG. 26 is a front elevational view of an important part of the mounting head illustrating the operation thereof;

FIG. 28 is a front elevational view of a mechanism for actuating the mounting head;

FIG. 29 is a front elevational view of the end portion of a depressing lever for the mounting head in the state where the operation roller of the mounting head actuating mechanism is in the lowermost position in its stroke;

FIG. 30 is a front elevational view of the depressing lever in the state in which the operation roller is in the uppermost position in its stroke;

DESCRIPTION OF THE PREFERRED EMBODIMENTS

A general description of the construction and operation of the apparatus for mounting chip type circuit elements onto a printed circuit board in its entirety will first be provided. More detailed descriptions of certain ones of the components of the apparatus then follow.

General Description of Apparatus

Figure 1:
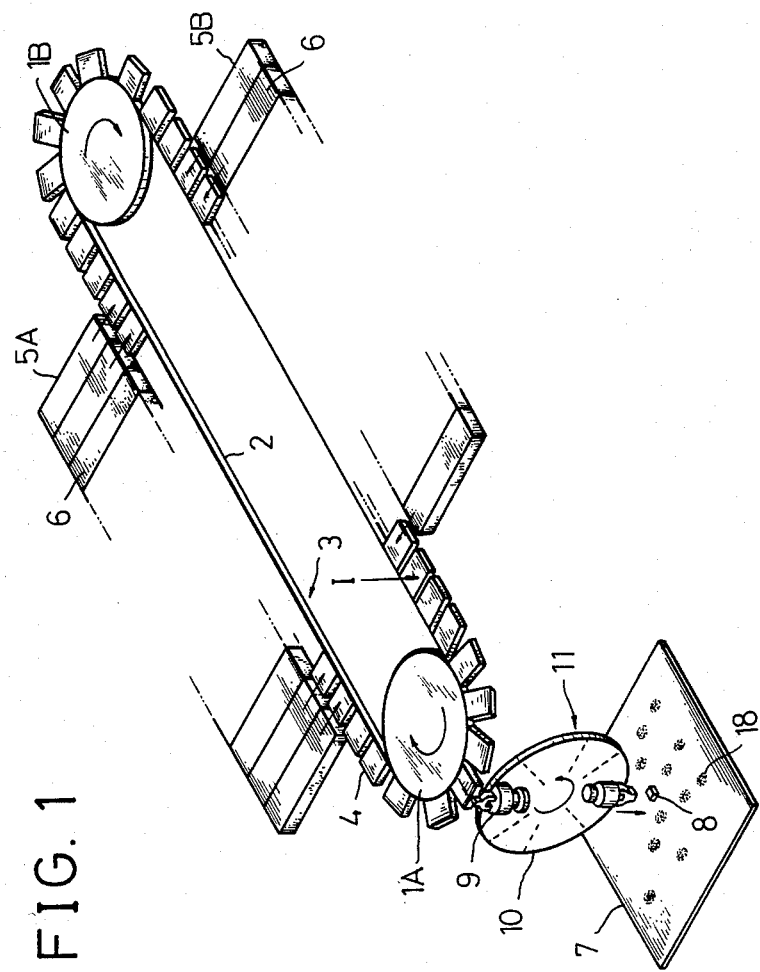
FIG. 1 is a general perspective view showing a chip type circuit element mounting apparatus in accordance with an embodiment of the invention.
Figure 2:
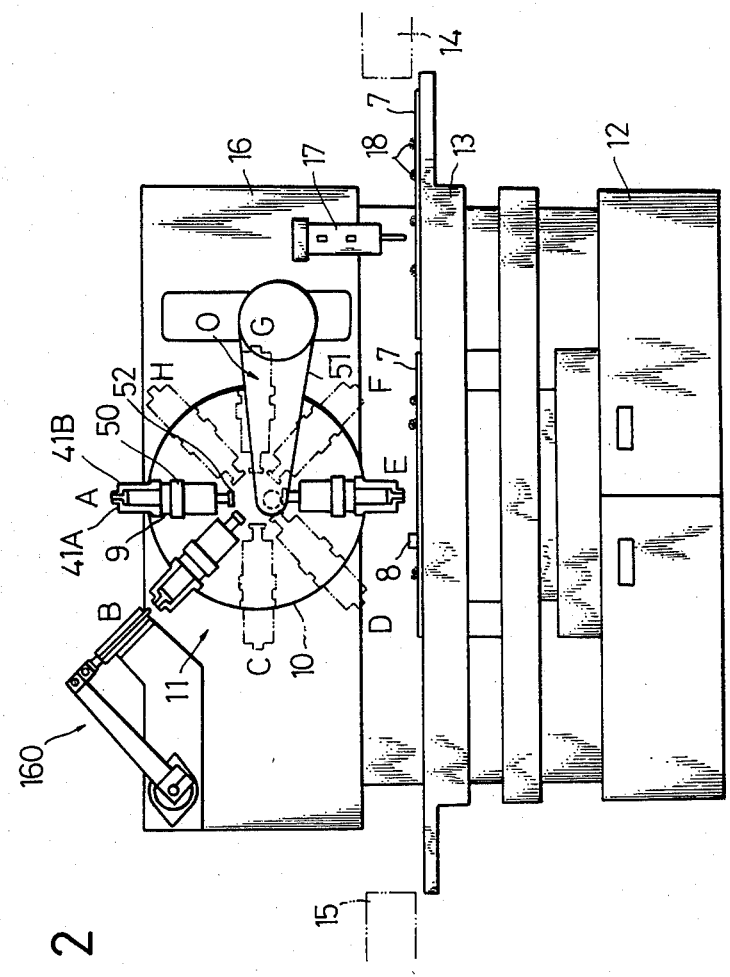
FIG. 2 is a front elevational view of a mounting mechanism having mounting heads.

Referring to FIGS. 1 through 6 wherein like reference characters designate identical or corresponding parts throughout the several views, and more particularly to FIGS. 1 and 2, the general arrangement of an apparatus for mounting chip type circuit elements in accordance with the invention is illustrated and includes an endless chain 2 stretched between a pair of sprockets 1A and 1B to run horizontally therebetween to constitute a chain conveyor mechanism 3. A multiplicity of horizontal pallets 4 are secured to the outer peripheral side of the chain 2 at a constant pitch and are adapted to be moved intermittently in accordance with the intermittent running of the chain 2. Supply units 5A, 5B are disposed in opposed relationship to the linear rows of the pallets 4. Each of the supply units 5A and 5B has a multiplicity of part feeders 6 arranged at the same intervals or pitch as that of the pallets 4. Each part feeder 6 accommodates only one kind of chip type circuit element, and the part feeders deliver their parts to the pallets 4 in accordance with a predetermined order set in a mounting program for mounting the circuit elements.

Referring now to FIG. 2, the apparatus for mounting chip type circuit elements on printed circuit boards include a frame base 12 which carries an X-Y table (NC table) 13 at the right side of which (as seen in the Figures) is disposed a loader 14 for supplying a printed circuit board 7. An unloader 15 is disposed at the left side of the X-Y table 13 for removing the particular printed circuit board 7 carried on the X-Y table 13.

A frame 16 is fixed to the base 12 and projects upwardly therefrom at the rear side of the X-Y table 13. A dispenser 17 is disposed at the front side of the frame 16 for supplying an adhesive 18 to the printed circuit 7 when the latter is situated on the right-side position of the X-Y table 13.

The printed circuit board 7 is supplied by the loader 14 to the right-side position of the X-Y table 13. Prior to the mounting of the chip type circuit element on the printed circuit board 7, an adhesive 18 is applied by the dispenser 17 to the printed circuit board 7 as shown in FIG. 2. More specifically, referring to FIG. 3, the dispenser 17 is pivotally attached to the frame 16 by a pair of parallel links 19A and 19B in such a manner that the dispenser 17 can be vertically positioned. In this connection, a lever 19C is operatively connected to link 19A for driving the same.

In the illustrated embodiment, the dispenser 17 applies an adhesive 18 to the positions on the printed circuit board 7 where the chip type circuit elements are to be mounted as seen in FIG. 1 in a sequential manner repeating the vertical movements.

Referring back to FIG. 1, a plurality of mounting heads 9 for mounting the chip type circuit elements 8 on the portion of the printed circuit board applied with the adhesive 18 are arranged on an indexing disc 10 at 45° intervals to constitute a mounting mechanism 11. The indexing disc 10 is adapted to rotate intermittently at an angular pitch of 45°. Each of the mounting heads 9 is adapted to receive, when it takes a upright posture, the chip type circuit element 8 from a pallet 4 and, when it takes a downward posture, is adapted to release and place the chip type circuit element onto the circuit board 7.

FIG. 4 shows the detail of the chain conveyor mechanism 3. As will be seen from this Figure, the chain 2 is adapted to run along a groove formed in a chain guide 21 fixed to a frame 20. The chain guide 21 is provided to prevent any excessive flexing or slacking of the chain 2. Pallets 4 are attached to the upper face of the chain 2 through the medium of pallet mounting plates 22. The pallet mounting plate 22 is pressed at its upper side by a rubber roller 25 rotatably supported by a shaft 24 carried by a supporting block 23 fixed to the frame 20. The aforementioned rubber roller 25 is mounted in plural at a predetermined interval, so that any inclination of the pallets 4 is effectively avoided. A slidable stopper member 26 has a wedge-shaped end adapted to penetrate the supporting block 23 and the chain guide 21. When the chain 2 is stopped, the stopper 26 is projected as a result of a rotation of the bell crank 27 in the direction of the arrow J to come into the gap between links of the chain 2 to limit or normalize the position of the chain 2. At the same time, a locating pin 28 is lowered from the upper side to fit in the locating hole 29 formed in the pallet mounting plate 22 to locate the latter. This is necessary because it is difficult to correctly locate the pallet 4 solely through the chain, considering that the chain 2 tends to be stretched or elongated and become loose during extended use. The accuracy of the positioning of the chain 2 can be increased by providing the stoppers 26 and the locating pins 28 at constant intervals.

Figure 5:
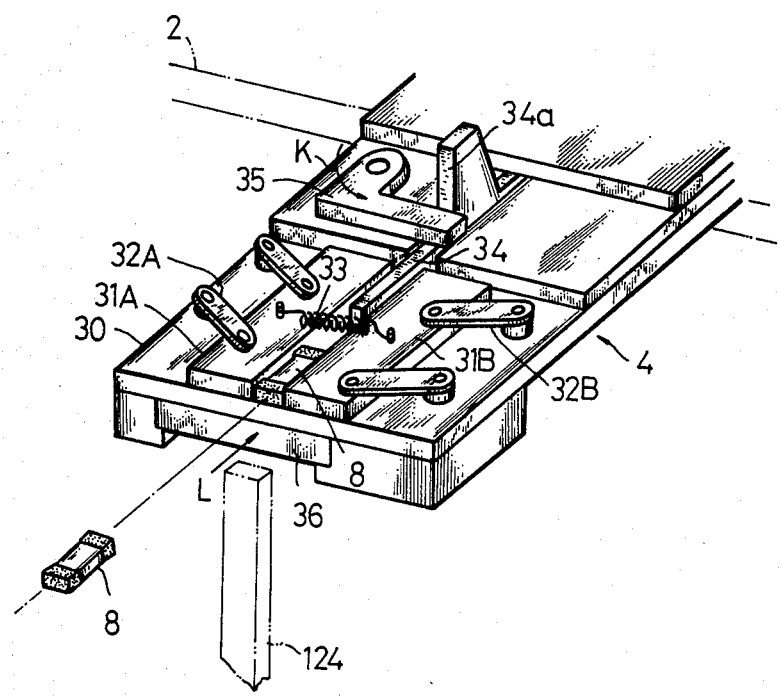
FIG. 5 is a perspective view showing a pallet.

Referring now to FIG. 5 showing the detail of a pallet 4, a pallet base 30 carries a pair of gripping bars 31A, 31B which are movable in a parallel manner by means of parallel links 32A, 32B. A tension spring 33 is stretched between the gripping bars 31A and 31B to urge the latter towards each other. A reciprocatable push rod 34 slidable in back and forth direction is disposed between the gripping bars 31A and 31B and a retainer lever 35 for retaining the push rod 34 in the retracted position is pivotally secured to the pallet base 30. More specifically, the retainer lever 35 is biased in the direction of an arrow K by a coiled spring (not shown) to bring its end into contact with a projection 34a on the push rod 34. At the same time, an operation block 36 is slidably supported on the lower face of the pallet base 30. As this operation block 36 is pushed in the direction of an arrow L by the action of a pallet opening lever 124, the parallel links 32A and 32B are rotated to open the gripping bars 31A and 31B. The operative connection between the parallel links 32A, 32B and the operation block 36 is achieved through a known gear or a link mechanism which is not shown. A chip type circuit elements 8 is supplied to the pallet 4 from the part feeder 6 first moving the gripping bars 31A, 31B apart from each other by pushing the operation block 36 in the direction of the arrow L by the operation of the pallet opening lever 124 and then pushing the chip type circuit element 8 into the gap between the gripping bars 31A and 31B.

Figure 6:
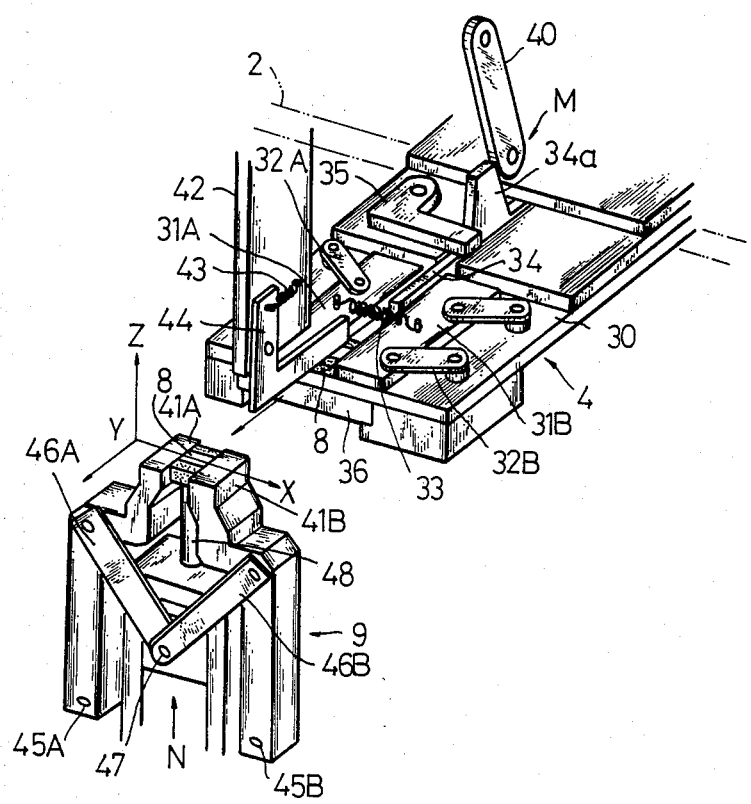
FIG. 6 is a perspective view illustrating the operation wherein a chip type circuit element is shifted from the pallet to the mounting head.

Referring again to FIG. 2, the mounting mechanism 11 includes eight mounting heads 9 arranged on the indexing disc 10 at 45° intervals, so that each mounting head 9 is adapted to travel successively past eight stations, namely stations A,B,C,D,E,F,G and H. A mounting head 9 receives the chip type circuit element 8 from the pallet 4 only when it takes an upward posture, i.e. only when it is located at station A. FIG. 6 shows how the chip type circuit element 8 is transferred from a pallet 4 to a mounting head 9.

Referring to FIG. 6, when the pallet 4 reaches a position immediately opposed to the mounting head 9 (although the pallet 4 and the mounting head 9 are illustrated in FIG. 6 as being considerably spaced apart from each other for the purpose of simplifying the following explanation, it is understood that these two members are actually extremely close to each other at the described positions), a push-out lever 40 becomes aligned with a projection 34a of the push rod 34 of the pallet 4 so as to be contactable therewith, so that the push rod 34 is moved ahead in accordance with the rotation of the push-out lever 40 in the direction of the arrow M. In consequence, the chip type circuit element 8 is forced into the gap between two gripping members 41A and 41B of the mounting head 9. In this state, the chip type circuit element 8 is gently pressed at its upper surface by a guide lever 44 which is pivoted to a supporting plate 42 above the pallet 4 and biased by a spring 43 downwardly so that the chip type circuit element 8 is prevented from floating or moving.

The gripping members 41A, 41B of the mounting head 9 is rotatable around the pivot points 45A, 45B with respect to the mounting head body. The arrangement is such that the gripping members 41A, 41B are moved to open and close, respectively as a pivot point 47 of links 46A, 46B pivoted to intermediate portions of the gripping members 41A, 41B is moved upwardly and downwardly. The mounting head 9 is provided with a suction pin 48 in addition to the gripping members 41A, 41B. This suction pin 48 takes a position intermediate between the gripping members 41A and 41B and is adapted to draw under suction and hold the chip type circuit element 8 forced out of the pallet 4. This distance between the gripping members 41A, 41B is greater than the breadth of the chip type circuit element 8 when the latter is delivered from the pallet 4. Therefore, prior to the mechanical gripping by the gripping members 41A, 41B, the chip type circuit element is drawn and held by the vacuum or suction force on the suction pin 48, and then the gripping members 41A, 41B are moved toward each other to mechanically clamp the chip type circuit element 8.

At the station B shown in FIG. 2, the chip type circuit element 8 is located in the Y-direction, i.e. in the longitudinal direction of the gripping members 41A, 41B, by the operation of a chip type circuit element locating mechanism 160. At the station C, a 90° rotation of the mounting head 9 in either direction is effected as necessitated to change the orientation of the chip type circuit element. This is achieved by bringing a gear (not shown) into engagement with a gear 50 (FIG. 2) formed on a part of the periphery of the mounting head 9 from the reverse side of the indexing disc 10. When the mounting head 9 is oriented downwardly, i.e. when the same reaches the station E, the head portion 52 of the mounting head 9 is depressed by a rotation of the depression lever 51 in the direction of an arrow O, so that the suction pin 48 is lowered to bond the chip type circuit element 8 to the area on the circuit board 7 applied with the adhesive 18.

The 90° turning of the chip type circuit element 8 may be conducted at the station I (FIG. 1) located on the chain conveyor mechanism 3. In such case, the gripping bars 31A, 31B of the pallet 4 are moved apart from each other and the chip type circuit element 8 is rotated by a suction head (not shown) provided with a suction pin or by specific gripping means adapted to clamp and rotate the element 8.

The operation of the chip type circuit element mounting apparatus of the present invention will now be described.

At the initial stage of the operation, the X-Y table 13 assumes an origin position and in this condition the supply of the printed circuit board 7 is commenced to the right position of the X-Y table 13.

At this point, adhesive 18 is applied according to a predetermined program to the locations on the printed circuit board 7 to which the circuit elements 8 are to be mounted by means of the dispenser 17. The X-Y table 13 is then returned to its origin position after the completion of application of the adhesive. During this operation, the mounting heads 9 remain idle.

While the X-Y table 13 is stationary at its point of origin after the application of the adhesive 18 to the printed circuit board 7, the kind of the chip type circuit element 8 is selected in accordance with a predetermined sequence, and the selected chip type circuit elements 8 are successively fed into the gap between the gripping bars 31A, 31B of the pallets 4 successively from the part feeders of the supply units 5A, 5B. The pallet 4 then runs intermittently in accordance with the intermittent running of the chain conveyor mechanism 3, while gripping the chip type circuit elements between the gripping bars 31A, 31B thereof. It will be understood that before each pallet 4 reaches the position in front of a mounting head 9, it is loaded with one of a plurality of chip type circuit elements 8 in accordance with the predetermined order of sequence. It is possible to provide that the orientation of the chip type circuit element 8 be changed if necessary by the aforementioned 90° rotation in either direction. Then, as the pallet 4 is moved to the position where it is in immediate opposed relationship with the mounting head at station A, the chip type circuit element 8 is forced out from the pallet 4 onto the mounting head 9, and is gripped by the gripping members 41A and 41B of the mounting head 9.

The circuit elements 8 on the pallets 4 are successively shifted to the mounting heads 9 through the operation of the push-out lever 40. The mounting head 9, holding the chip type circuit element gripped between the gripping members 41A, 41B thereof, is rotatably indexed past the stations A, B and C successively. At the station C the change of orientation of the chip type circuit element is effected as necessitated by a 90° rotation in either direction.

The operation is momentarily stopped as the mounting head 9 carrying the first circuit element reaches the station E.

During the momentary suspension of operation, the printed circuit board 7 which has reached the right-side position on the X-Y table 13 is then moved to the central position and a new printed circuit board is supplied to the right-side position by the operation of the loader 14.

Thereafter, the mounting of the chip type circuit element 8 to the printed circuit board 7 which is in the central position and the application of the adhesive 18 to the printed circuit board 7 on the rightside position are simultaneously commenced.

The head portion 52 of the mounting head 9 upon reaching the station E shown in FIG. 2 is depressed by the depressing lever 51 so that the suction pin 48 is lowered to press the chip type circuit element 8 held by the suction pin 48 onto the portion of the printed circuit board 7 where adhesive 18 has been applied whereupon the circuit element 8 is mounted on the printed circuit board 7.

After the operations described above have been completed, the X-Y table 13 is returned to its original position so that the printed circuit board 7 on which the chip type circuit element has been mounted is moved from the central position to the left position while at this time the subsequent printed circuit board is moved from the right-side position to the central position. During this time a new printed circuit board is fed to the right side position.

Thus, the application of the adhesive to the printed circuit board and the mounting of the chip type circuit element thereto are accomplished at the right-side and central positions of table 13, respectively. Simultaneously, a checker (not shown) may operate at the left-side position of table 13 to monitor and detect any mismounting of the circuit element on the printed circuit board. If no mismounting is detected, the printed circuit board 7 is removed from the X-Y table 13 by means of the unloader 15.

The operation described hereinbefore is repeated in sequence to complete the mounting of the chip type circuit elements on the printed circuit board.

The embodiment described heretofore offers the following advantages.

(1) Since the pallet 4 and the mounting head 9 transfer the chip type circuit elements while mechanically gripping the same, it is possible to attain a higher speed of transfer and, hence, a higher speed of mounting of the circuit elements.

In the known apparatus in which the mounting head only has a suction pin for holding and transferring the circuit element to the circuit board or in another known apparatus in which the circuit element is placed on the pallet through the medium of an adhesive mat, it is often experienced that the circuit element is lost or the position of the circuit element is offset from the right position. This problem, however, is completely eliminated in the apparatus of the invention in which the chip type circuit elements are transferred while being mechanically gripped by the pallet 4 and the mounting head 9. Thus, the apparatus of the invention provides a high precision of mounting and, hence, the reliability is remarkably improved. Furthermore, the mechanical gripping type handling construction permits a larger tolerance of the size of the chip type circuit elements, which in turn enables the apparatus to handle a large variety of chip type circuit elements.

(2) Since the chip type circuit elements 8 are mounted on the circuit board by means of the mounting head 9 provided with the suction pin 48 and the gripping members 41A, 41B, it is possible to mount the circuit element 8 to the desired space or location on the circuit board 7 without fail even after the mounting of another electronic part or parts.

(3) It is possible to array various kinds of chip type circuit elements in each pallet 4 in the order or sequence of the mounting. This advantageously permits an efficient mounting of a large variety of chip type circuit elements.

(4) A change in the angular orientation of the chip type circuit element can be made when the pallet 4 has reached the station I and/or when the mounting head 9 has reached the station C. The change of orientation of the chip type circuit element is made by rotating the pallet 4 or the mounting head 9 by 90° in either direction. It is thus possible to obtain four mounting orientations of 0°, 90°, 180° and 270°. The apparatus, therefore, can advantageously be used in the mounting of elements having three terminals, e.g. transistors. As has been described, according to the invention, it is possible to precisely mount the chip type circuit element even to a small space on the circuit board without fail. In addition, it is possible to mount the chip type electronic elements at a high speed and with complete reliability.

Supply Unit

Referring now to FIGS. 7 through 13, the construction of a supply unit for supplying chip type circuit elements suitable for use in the arrangement of the present invention will be described.

Figure 7:
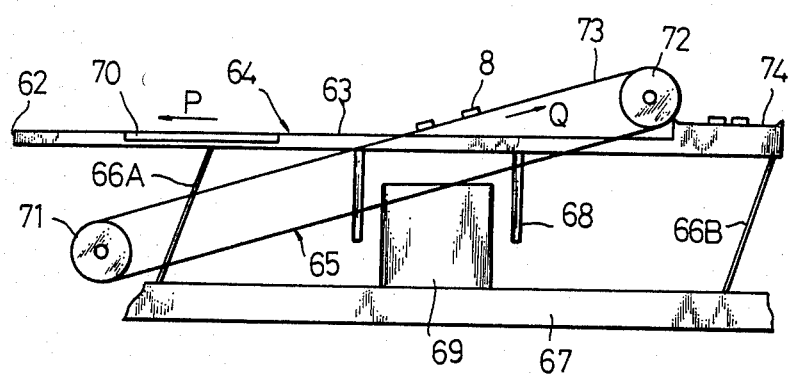
FIG. 7 is a front elevational view of a supply unit for supplying the chip type circuit elements.
Figure 8:
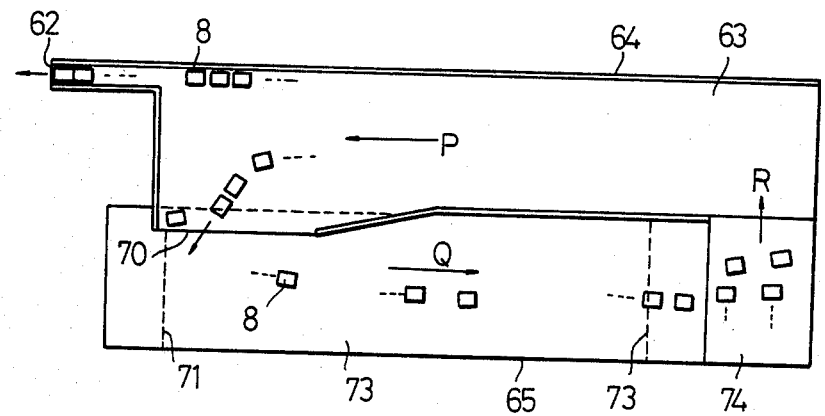
FIG. 8 is a plan view of the supply unit shown in FIG. 7.

Referring first to FIGS. 7 and 8, the supply unit has a part feeder section 64 equipped with a vibration table 63 for conveying the elements 8 to the supply port 62, and a conveyor belt 65 for returning the chip type circuit elements which could not be arrayed on the part feeder section 64 but dropped off therefrom back to their starting positions.

In the part feeder section 64, the vibration table 63 is supported on a base 67 through the medium of the leaf springs 66A and 66B. An attractable member 68 made of a plate of a magnetic material such as of iron is adapted to be attracted by a solenoid 69. As the solenoid 69 is energized by an alternating current (A.C.), the vibration table 63 is vibrated back and forth to transfer the chip type circuit elements 8 on the vibration table 63 forwardly as indicated by an arrow P. The end of the vibration table 63 constitutes a supply opening 62 for forwarding the arrayed chip type circuit elements 8, while the side edge of the same near the abovementioned end defines a return opening 70 through which the surplus chip type circuit elements which could not be arrayed are made to fall onto the conveyor belt 65.

The aforementioned conveyor belt 65 includes a belt 73 stretched between a leading side pulley 71 and a trailing side pulley 72. The belt 73 is adapted to run from the leading side to the trailing side as indicated by an arrow Q. The pulley 71 is held at a level below the vibration table 63 while the pulley 72 is held above the vibration table 63. An inclined pan 74 is disposed to receive the chip type circuit elements 8 dropping from the rear end of the conveyor belt 65. The inclined pan 74 is constituted by an inclined surface the lower end of which is connected to the rear end of the vibration table 63.

In the arrangement described above, the chip type circuit elements 8 on the rear end of the vibration bed 63 are moved forwardly as a result of vibration of the vibration table 63. The elements 8 which have been properly aligned or arrayed are forwarded to the supply port 62. On the other hand, the elements 8 which have come out of the array are made to drop onto the conveyor belt 65 through the return port 70 and, as the belt 73 runs in tthe direction of the arrow Q, drop onto the inclined pan 74 from the rear end of the belt 73. The elements 8 then slide down along the inclined pan 74 in the direction of the arrow R to be returned again to the vibration table 63.

In the embodiment described hereinbefore, it is possible to increase the speed at which the chip type circuit elements 8 are returned because of the use of the conveyor belt 65 for the returning operation. Therefore, even when the chip type circuit elements 8 are successively taken out of the supply port 62 of the part feeder section 64 one by one at a high speed, the vibration table 63 always holds a sufficiently large quantity of the chip type electronic parts. In addition, since the vibration is imparted to the chip type circuit elements 8 only during the forward movement of the latter, the damage of the elements 8 is effectively suppressed as compared with the known arrangement in which vibration is also used in connection with the returning of the chip type circuit elements 8.

As has been described, according to the embodiment described heretofore, it is possible to increase the speed of returning of the chip type circuit elements and, hence, obtain a chip type circuit element supplying unit operable at a high speed which in turn is suitable for use as the supply unit of a chip type circuit element mounting apparatus which is required to operate at a high speed.

An embodiment of the part feeder suitable for use in combination with the supplying unit explained hereinbefore in connection with FIGS. 7 and 8 will be described with specific reference to FIGS. 9 and 10.

Figure 9:
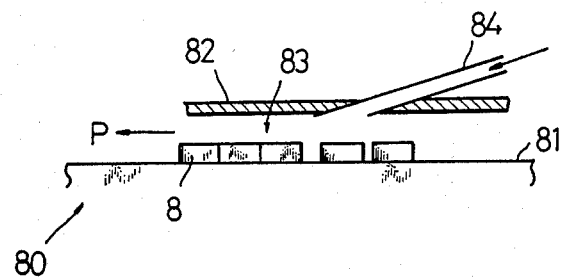
FIG. 9 is a sectional side elevational view of an example of the part feeder.

Referring first to FIG. 9, a part feeder 80 includes a vibration table 81 adapted for feeding the chip type circuit elements 8 forwardly, i.e. in the direction of an arrow P, by vibration. A shield plate 82 is disposed above the vibration table 81, which defines a passage through which air is blown. An air blow pipe 84 is provided for blowing air into the space 83 between the vibration table 81 and the shield plate 82 in the direction of movement of the chip type circuit element 8. The shield plate 82 covers the upper side and, as desired, the lateral side of the vibration table 81.

Figure 10:
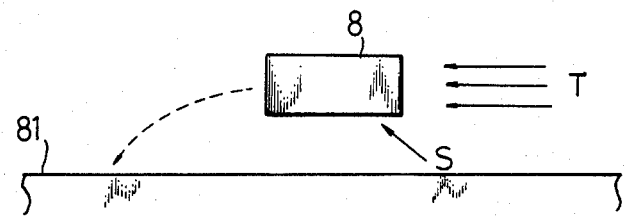
FIG. 10 is an illustration of the part feeder shown in FIG. 9.

In the arrangement described hereinbefore, the chip type circuit elements 8 float obliquely upwardly and forwardly as a result of the vibration of the vibration table 81 as indicated by an arrow S in FIG. 10. Since the air is blown forwardly from the air blow pipe 84 as indicated by an arrow T, each chip type circuit element can fly a large distance forwardly before it lands or drops on the vibration table 81. It is, therefore, possible to convey the chip type circuit elements at a high rate in a rational manner as compared with the case where the chip type circuit elements are conveyed solely by the vibration of the vibration table 81. The scattering of the chip type circuit elements 8 and other difficulties can be avoided by suitably selecting the blow rate of the air.

Thus, according to the described embodiment of the invention, it is possible to obtain a part feeder which can convey chip type circuit elements at an extremely high speed.

Figure 11:
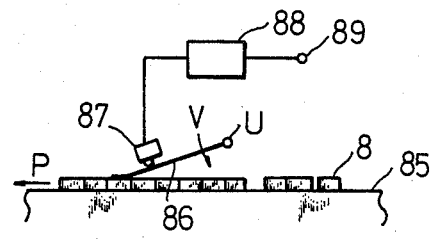
FIG. 11 is a side elevational view of a part quantity detecting device of the part feeder, showing the state in which there are sufficient elements.
Figure 12:
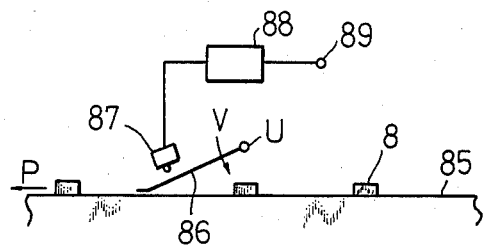
FIG. 12 is a view similar to that in FIG. 11 but showing the state in which the quantity of the elements has been reduced below an adequate quantity.
Figure 13:
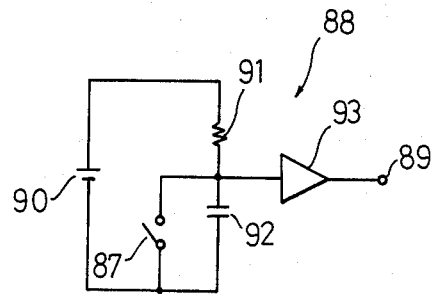
FIG. 13 is a circuit diagram of an embodiment of a detection circuit having a time limiting function.

Referring further to FIGS. 11 through 13, another embodiment of a part feeder suitable for use in combination with the embodiment of the supply unit shown in FIGS. 7 and 8 will be described.

This embodiment has as an object the provision of a device for detecting the quantity of elements in the part feeder and which is capable of detecting that the quantity of the elements in the part feeder has diminished below a predetermined adequate quantity.

Referring to FIGS. 11 and 12, a lever-shaped actuator 86 is disposed above a vibration table 85 of the part feeder adapted to transfer the chip type circuit elements forwardly, i.e. in the direction of the arrow P, by vibration. This actuator 86 is swingable around a fulcrum U and is lightly biased towards rotation in the direction of arrow V. A microswitch 87 is disposed at such a position that the microswitch 87 is operated by the end of the actuator 86 when the latter is contacted and lifted by the chip type circuit element 8 to rotate in a direction opposite that of arrow V. The microswitch 87 is connected to a detection circuit 88 having a time limiting function. This time limiting detection circuit 88 is adapted to produce, when the actuator 86 is held in the lowered position due to an absence of the chip type circuit element 8 (FIG. 12) for a predetermined time length, e.g. several seconds, a signal at the output terminal 89 thereof, which signal is representative of a shortage of the elements 8.

FIG. 13 shows an example of the time limiting detection circuit 88. This circuit includes a time constant circuit which is a series circuit composed of a resistor 91 and a capacitor 92 and connected to a D.C. power supply 90. The aforementioned microswitch 87 is connected in parallel to the capacitor 92. The voltage appearing at the terminals of the capacitor 92 is applied to an amplifier 93 which is adapted to operate at a voltage exceeding a predetermined voltage.

In the embodiment described hereinbefore, if there is sufficiently large quantity of the chip type circuit elements 8 on the vibration table 85 of the part feeder, the elements 8 are arrayed in the conveyance direction without any gap or vacancy as shown in FIG. 11, so that the end of the actuator 86 is held at the raised position. The microswitch 87, therefore, is held in the on state. In this state, therefore, the time limiting detection circuit 88 does not operate.

On the other hand, in the event that the quantity of the chip type circuit elements 8 on the vibration table 85 diminishes below a predetermined one, a large gap or vacancy is formed in the array of the chip type circuit elements 8 as shown in FIG. 12. In consequence, the end of the actuator 86 is lowered to turn the microswitch 87 off and, as the microswitch 87 is held in the off state for a period exceeding a predetermined time length, the voltage appearing between the terminals of the capacitor 92 is increased beyond the operation voltage of the amplifier 93, so that the amplifier produces a signal representing a shortage of the chip type circuit elements.

As will be understood from the foregoing description, according to the described embodiment, it is possible to detect any shortage of the chip type circuit elements 8 without fail, by a device having a simple construction. In addition, any erroneous operation due to a relatively instantaneous turning on and off of the microswitch 87, i.e. the hunting of the microswitch 87, is avoided due to the time limiting function of the detection circuit 88.

The particular arrangement of the detection circuit 88 described heretofore is not exclusive and it will be understood that the same can be varied or modified suitably.

Thus, this embodiment provides a device for detecting the quantity of the chip type circuit elements, suitable for use in combination with a part feeder and capable of detecting shortage of the chip type circuit elements with a simple construction.

Shifting Mechanism For Shifting Chip Type Circuit Element

Referring now to FIGS. 14 through 18, the constructional and operational details of a shifting mechanism for shifting the chip type circuit elements will be described. Such description will be in connection with a shifting mechanism which shifts the chip type circuit elements from the part feeder of the supply unit to the pallets and it is understood that a similar shifting mechanism may also be utilized, for example, with the shifting mechanism for shifting the chip type circuit elements from the pallets to the mounting heads.

Figure 14:
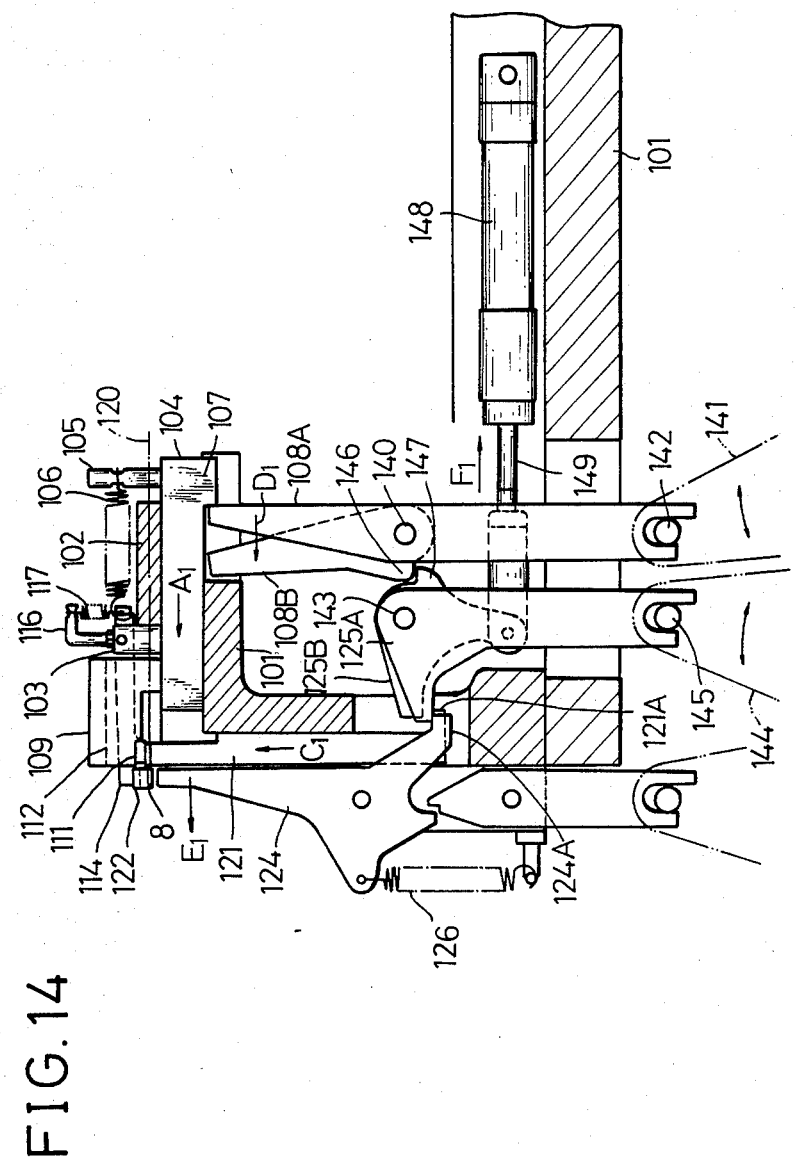
FIG. 14 is a sectional side elevational view of an embodiment of a chip type circuit element transferring mechanism.
Figure 15:
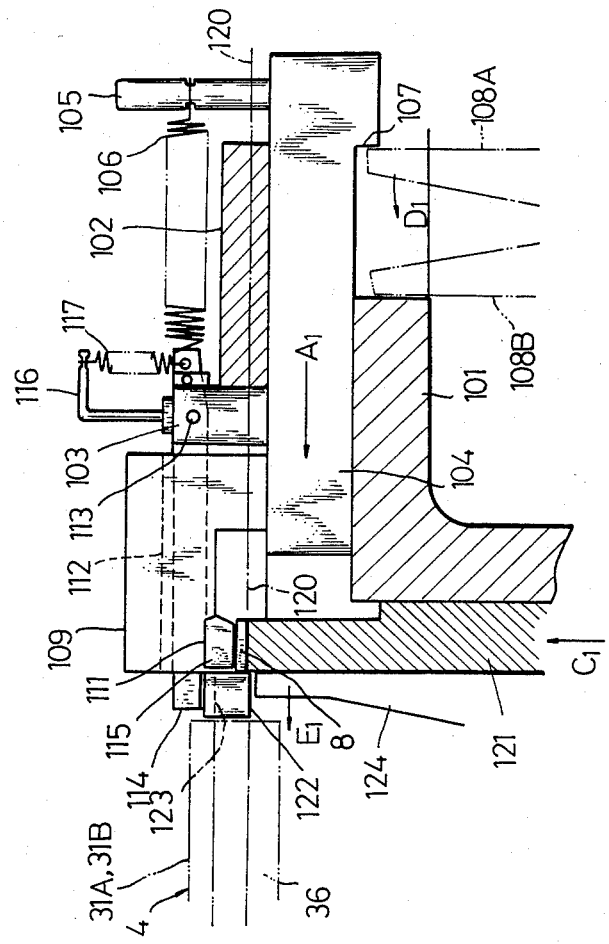
FIG. 15 is a sectional side elevational view showing an important part of the embodiment shown in FIG. 14.
Figure 16:
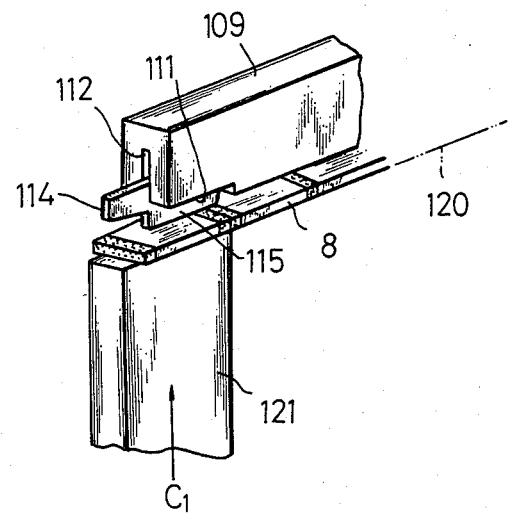
FIGS. 16 to 18 are perspective views illustrating the operation of the mechanism shown in FIG. 14.
Figure 17:
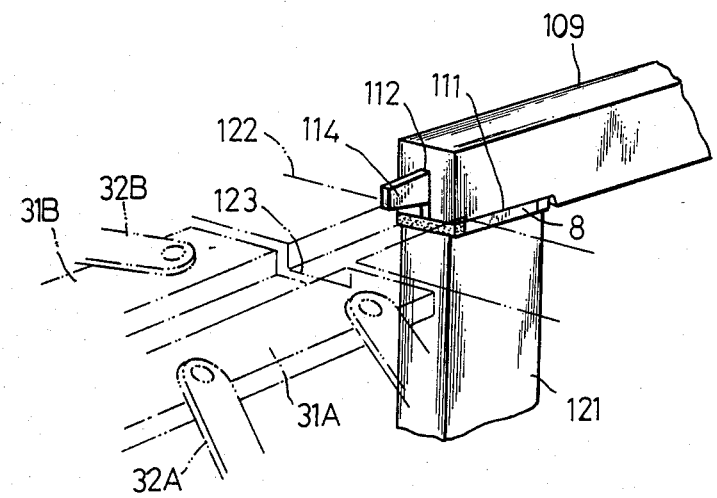
Figure 18:
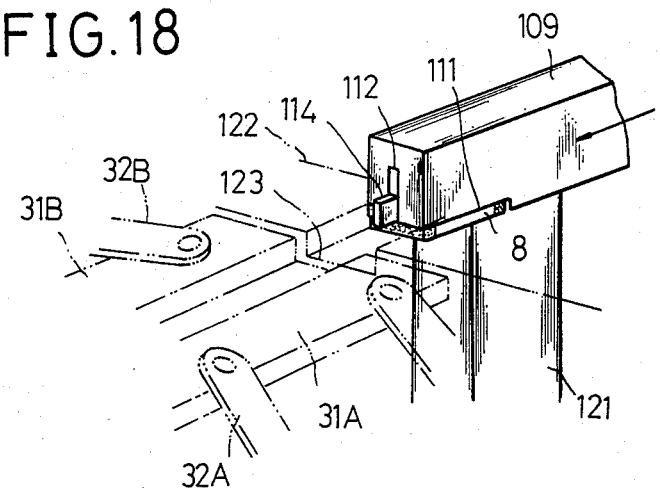

Referring to FIGS. 14 and 15, stationary blocks 102 and 103 are fixed above a base frame 101 at a suitable distance from each other. A slider 104 is adapted to be slided back and forth into the gap between the stationary blocks 102 and 103. The slider block 104 is provided at its rear end with a pin 105. A tension spring 106 is stretched between the pin 105 and the stationary block 103 so that the slider 104 is biased forwardly, i.e. in the direction of an arrow $A_1$. The return motion of the slider 104 is effected by means of slider actuating levers 108A, 108B which contact a projection 107 formed on the lower surface of the slider 104. A chip force-out slider 109 is fixed to the forward end of the slider 104 so as to move as a unit with the slider 104. As shown in FIGS. 16 through 18, a notch 111 engageable with the chip type circuit element 8 is formed in the lower surface of the leading end of the chip force slider 109. At the same time, an elongated vertical groove 112, perpendicular to the lower surface and opening in the lower surface is formed in the chip force-out slider 109. The vertical groove 112 vertically movably receives a chip pressing lever 114 pivoted to the stationary block 103 by a pin 113. The chip pressing lever 114 is provided at its lower end with a projection 115 adapted to abut the top surface of the chip type circuit element 8. A tension spring 117 is stretched between the rear end of the chip pressing lever 114 and a pin 116 provided on the stationary block 103. Consequently, the chip pressing lever 114 is biased in a direction so as to depress the chip type circuit element 8. On the other hand, a chip push-up slider 121 is disposed so as to be vertically slidable at the end of the lower surface 120 of a chute (supply port) of the part feeder. The lower surface 120 of the chute is shown by one-dot-and-dash line in FIGS. 14 and 15. This chip push-up slider 121 is normally biased upwardly by a spring which is not shown, and is adapted to be driven downwardly by actuator levers 125A, 125B which contact a projection 121A formed at the lower end of the chip push-up slider 121. The chip push-up slider 121 is adapted to be flush with the chute lower surface 120 when it takes the lowered position. A chip guide member 122 is fixed to a portion ahead of the chip push-up slider 121. The chip guide member 122 is provided with a chip guide groove 123 the bottom surface of which is flush with the chip push-up slider 121 when the latter takes the raised position. A pallet opening lever 124 is pivotally secured to the base frame 101. When the pallet 4 takes a predetermined position where it is in opposed relationship to the chip guide member 122, the pallet opening lever 124 opens the pallet 4 to ready the latter for receiving the chip type circuit elements 8. The pallet opening lever 124 is biased by a tension spring 126 in a counter-clockwise direction. The clockwise returning motion of the pallet opening lever 124 is effected by actuator levers 125A, 125B which abut a projection 124A formed on the rear end of the pallet opening lever 124.

The slider actuator levers 108A, 108B are rotatably held by supporting shafts 140. The slider actuator lever 108A engages at its rear end with a pin 142 on a cam follower 141 so that the front end of the slider actuator lever 108A makes a reciprocatory motion at a high speed by the operation of a cam mechanism which is not shown.

The actuator levers 125A, 125B are held rotatably by support shafts 143. The actuator lever 125A engages at its rear end with a pin 145 of a cam follower 144, so that the front end of the actuator lever 125A makes a reciprocating motion at a high speed by the operation of a cam mechanism which is not shown. The slider actuator lever 108B and the actuator lever 125B are provided with projections 146 and 147, respectively. The actuator lever 125B is connected at its lower end to the rod 149 of a cylinder 148 which is pivotally secured to the base frame 101.

On the other hand, the pallet 4 which is located in close proximity to the chip guide member 122 and in opposed relationship to the latter has a construction as shown in FIG. 5 discussed above. More particularly, referring back to FIG. 5, the pallet 4 includes the pallet base 30 fixed to the chain 2, and a pair of gripping bars 31A, 31B mounted on the pallet base 30 for free parallel movement by means of parallel links 32A, 32B. The gripping bars 31A and 31B are biased towards each other by a tension spring 33 stretched therebetween. The arrangement is such that, as the operation block 36 slidably secured to the lower side of the pallet base 30 is moved in the direction of the arrow L, parallel links 32A 32B are rotated to move the gripping bars 31A and 31B away from each other. The pallet 4 moves intermittently in accordance with the intermittent running of the chain 2. The arrangement is such that the pallet 4 is stopped at positions where the chip guide groove 123 of the chip guide member 122 is aligned with the gap between the gripping bars 31A and 31B.

In operation, the chip type circuit elements are arrayed in a row and are moved along the bottom surface 120 of the chute of the part feeder, and the chip type circuit element 8 which is at the foremost end of the array is transferred to the chip push-up slider 121 which is in the lowered position as shown in FIGS. 14 through 16. At this time, in the period in which this chip shifting mechanism is not selected, i.e. in the period in which the shifting of the element 8 is not conducted, the rod 149 of the cylinder 148 is retracted as indicated by an arrow $F_1$ to rotate the actuator lever 125B counter-clockwise while rotating the associated slider actuator lever 108B clockwise. In consequence, the slider 104 is held at the retracted position while the chip push-up cylinder 121 is held at the lowered position. At the same time, the pallet opening lever 124 is held at the retracted position. Therefore, the sliders 104, 121 and the lever 124 do not operate so that the shifting of the chip type circuit elements is not conducted, even though the slider actuator lever 108A and the actuator lever 125A are continuously driven reciprocatingly by the action of the cam mechanism.

As this chip type circuit element shifting mechanism is selected, the rod 149 of the cylinder 148 is extended to rotate the actuator lever 125B clockwise to permit the slider lever 108B counter-clockwise. Consequently, the slider 104 is actuated by the slider actuator lever 108A, and the chip push-up slider 121 and the pallet opening lever 124 are actuated by the actuator lever 125A, so that the shifting of the chip type circuit elements 8 is conducted. Namely, as the actuator lever 125A rotates clockwise, the chip push-up slider 121 is moved upward by the force of a spring as indicated by an arrow $C_1$, thereby to bring the chip type circuit element 8 thereon into engagement with the notch 111 in the chip push-out slider 109 as shown in FIG. 17. The slider actuator lever 108A is rotated in this state counter-clockwise as shown by an arrow $D_1$, so that the slider 104 is moved ahead by the force of the tension spring 106 as indicated by an arrow $A_1$. As a result, the chip push-out cylinder 109 integral with the slider 104 is moved ahead as shown in FIG. 18. Consequently, the chip type circuit element 8 is forced into the chip guide groove 123 in the chip guide member 122. It is to be noted here that the chip type circuit element 8 is pressed by the chip pressing lever 114 while it is held by the chip push-up slider 121, and is guided at its upper surface by the chip pressing lever 114 while it is held in the chip guide groove 123, so that the floating or offset from the correct position of the chip type circuit element 8 attributable to the vibration is completely eliminated. As this operation is repeated, the next or new chip type circuit element 8 is forced into the chip guide groove 123 so that the preceding chip type circuit element 8 is forced out from the chip guide groove 123 and is fed into the gap between the gripping bars 31A and 31B of the pallet 4 which is in opposed relationship to the chip guide member 122. Meanwhile, by the rotation of the pallet opening lever 124 in the direction of the arrow $E_1$, the operation block 36 is previously pressed to keep the gripping bars 31A and 31B in the opened state. After the completion of the supply of the chip type circuit elements 8 to the pallet 4, the levers 108A, 124, 125A and the sliders 104, 109, 121 are reset to the starting positions shown in FIG. 14.

According to the above-described arrangement, since the chip type circuit element 8 is shifted while being pressed at its upper surface by the chip pressing lever 114, it is possible to eliminate undesirable floating or offset of the chip type circuit element 8. Accordingly, it is possible to achieve a higher shifting speed and improved reliability of operation. Furthermore, the vacuum suction means can be dispensed with advantageously to permit an efficient transfer of the element 8 to a device which clamps the chip type circuit element 8 mechanically, e.g. the pallet 4. Furthermore, in order that the shifting of the chip type element 8 is performed only when desired, this embodiment incorporates two slider actuator levers 108A, 108B and two actuator levers 125A, 125B to form two combinations one of which is driven in one direction only when selected while the other is driven always at a high speed by the operation of the cam mechanism. It is, therefore, possible to effect the high-speed shifting only during the period necessitating the shifting.

As has been described, according to this embodiment, it is possible to obtain a shifting mechanism for shifting the chip type circuit elements 8 at a high speed and without fail from the part feeder 6 to the pallet 4 only in the selected period.

Mechanism For Positioning Chip Type Circuit Elements

In the arrangement shown in FIG. 6, the shifting of the chip type circuit element 8 from the pallet 4 to the mounting head 9 is conducted by driving the push rod 34 forwardly as a result of rotation of the push-out lever 40 in the direction of the arrow M. Namely, the push rod 34 is driven ahead to move the chip type circuit element 8 into the gap between the pair of gripping members 41A, 41B.

Representing the directions of the shorter axis and the longer axis of the chip type circuit element 8 on the mounting head 9 by X and Y, respectively, while representing the vertical direction by Z, the chip type circuit element 8 is prevented from moving in the X direction because it is gripped by the gripping members 41A and 41B, but there is a possibility that the chip type circuit element 8 will move in the Y direction because there is no means for restricting such a movement of the element 8. The movement of the element 8 in the Y direction may cause an offset of the position of mounting of the element 8 on the printed circuit board, unless suitable correction means is employed. The offset of the chip type circuit element 8 in the Z direction is less probable to occur because the element is drawn and held by the suction pin 48 between the gripping members 41A and 41B. It is, however, necessary to take suitable measures for preventing the floating of the element 8 in the Z direction during positioning of the element in the Y direction.

An embodiment of the mechanism for positioning the chip type circuit element will be explained hereinunder with reference to FIGS. 19 through 21.

Figure 19:
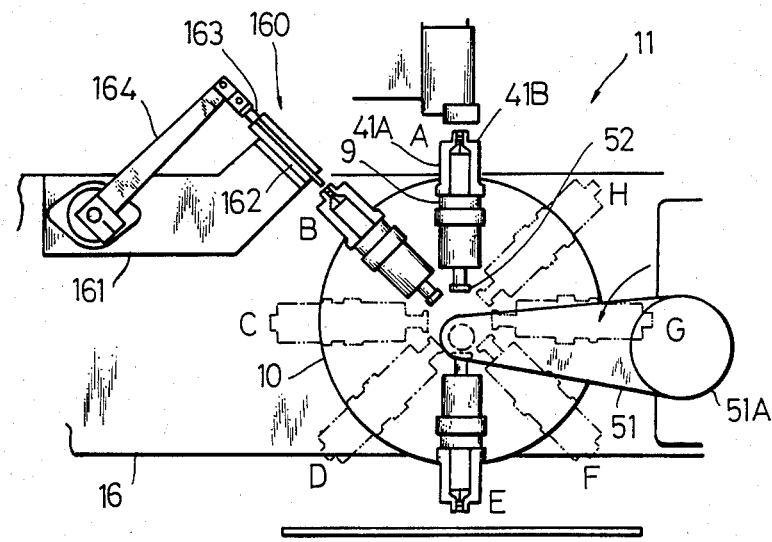
FIG. 19 is a front elevational view showing the arrangement of a chip type circuit element locating mechanism in a chip type circuit element mounting apparatus.
Figure 20:
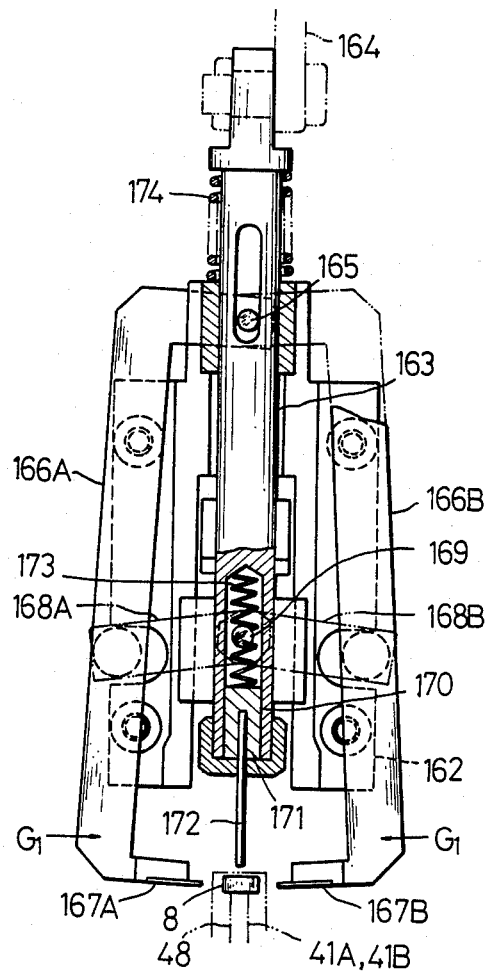
FIG. 20 is a plan view of an embodiment of the chip type circuit element locating mechanism, with its Y-direction locating claw in the opened state.
Figures 21, 22:
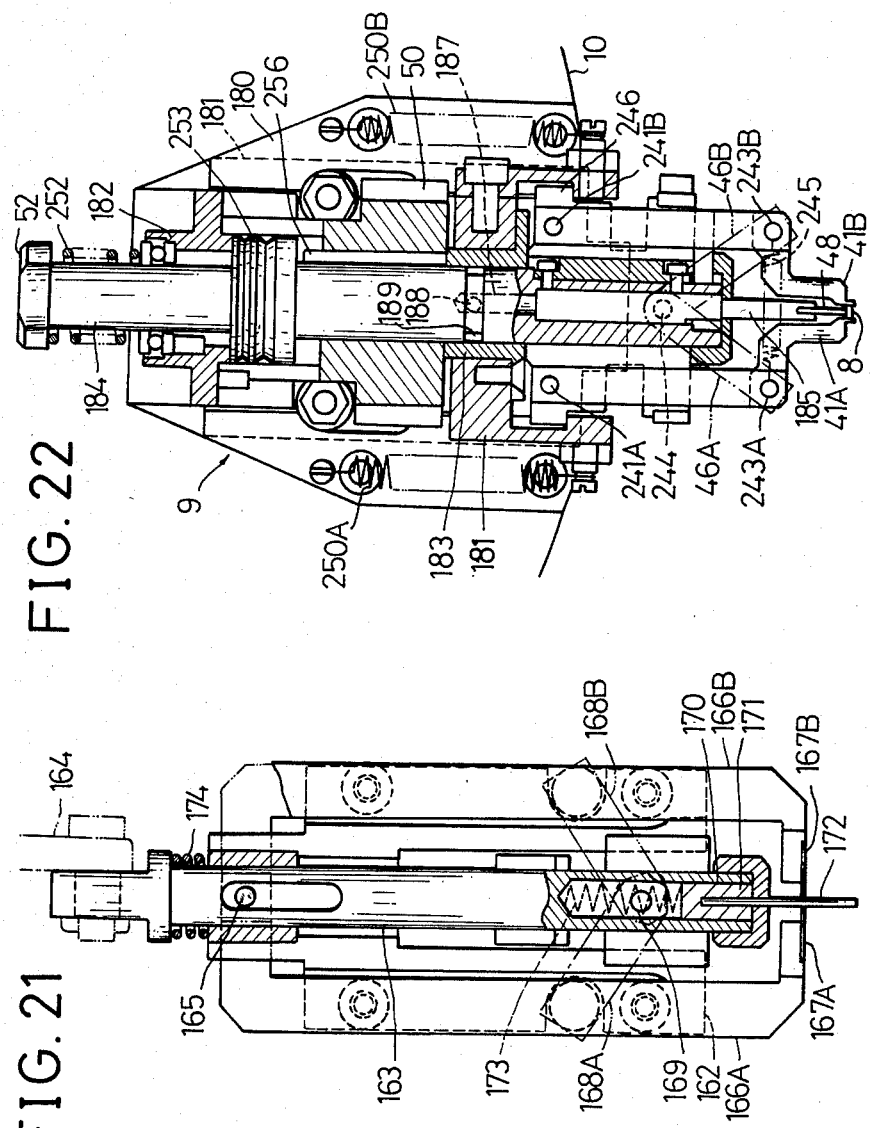
FIG. 21 is a plan view of the chip type circuit element locating mechanism with the Y-direction locating claw in the closed state.
FIG. 22 is a front elevational view showing the detail of the mounting head.

FIG. 19 shows how a mechanism 160 for positioning the chip type circuit elements is arranged on the apparatus for mounting the chip type circuit elements, while FIGS. 20 and 21 show the detail of the mechanism 160. Referring to FIG. 19, as explained before, eight mounting heads 9 are arranged on the indexing disc 10 at 45° intervals, so that each mounting head 9 can move successively past the stations A, B, C, D, E, F, G and H as the indexing disc 10 rotatably indexes. The positioning of the chip type circuit element 8 held by the mounting head 9 is made when the latter has reached the station B. Therefore, the chip type circuit element positioning mechanism 160 is arranged obliquely with respect to the frame 16 so as to be in opposed relationship to the station B. The chip type circuit element positioning mechanism 160 includes a supporting block 162 obliquely fixed to the frame 16 through a supporting arm 161, a slide shaft 163 slidably supported by the supporting block 162, and a driving lever 164 connected to the rear end of the slide shaft 163 and adapted to be actuated by a cam (not shown) provided on the frame 16. Furthermore, as shown in FIGS. 20 and 21, a pair of substantially U-shaped levers 166A, 166B for positioning the chip type circuit element 8 are pivotally secured to the supporting block 162 by means of pin 165 so as to be in opposed relationship to each other. Claws 167A, 167B for effecting the positioning in the Y direction are fixed to the ends of the positioning levers 166A, 166B. Links 168A and 168B are pivoted at their one ends to intermediate portions of the positioning levers 166A, 166B. The other ends of the links 168A, 168B are pivoted to the slide shaft 163 by means of pin 169.

Therefore, as the slide shaft 163 is lowered from the state shown in FIG. 20, the positioning levers 166A and 166B are rotated as indicated by an arrow $G_1$ in the direction for closing the positioning claws 167A and 167B. The slide shaft 163 has a hollow pipe-like end provided with a recess 170 which receives a push pin block 171 which is vertically movable. The push pin block 171 is provided with a push pin 172 fixed thereto. A compression spring 173 for depressing the push pin block 171 is disposed in the recess 170. A compression spring 174 for resetting the slide shaft 163 to the raised position is loaded between the base portion of the slide shaft 163 and the supporting block 170.

An explanation will be made hereinbelow of the operation of the mechanism 160 for positioning the chip type circuit elements. As the mounting head 9 is brought to the position B shown in FIG. 19, the chip type circuit element 8 gripped by the mounting head 9 is positioned between the claws 167A and 167B for Y-direction positioning as shown in FIG. 20. As the driving lever 164 is rotated in this state to depress the slide shaft 163, the push pin 172 is brought into contact with the top surface of the chip type circuit element 8, so that the chip type circuit element 8 is resiliently pressed by the force of the compression spring 173. Then, the levers 166A, 166B for positioning in the Y-direction are rotated in the direction of the arrow $G_1$, so that the Y-direction positioning claws 167A and 167B clamp the chip type circuit element 8 to position the same in the Y-direction. During this operation, the chip type circuit element is not offset in the Z-direction because it is pressed and retained by the pressing pin 172.

As has been described, the chip type circuit element positioning mechanism of this embodiment permits a precise and reliable positioning of the chip type circuit element gripped by the mounting head. It is, therefore, possible to enhance the precision of the mounting position of the chip type circuit element by using this positioning mechanism in combination with the apparatus for mounting the chip type circuit elements.

Mounting Mechanism

The mounting mechanism 11 which mounts the chip type circuit elements 8 on printed circuit board 7 will now be described in greater detail with reference to FIG. 19 and FIGS. 22 through 30. It is noted that such mounting mechanism is especially suited for mounting chip type circuit elements having no load wires in a one-by-one fashion on a printed circuit board.

FIG. 19 shows the arrangement of the entire mounting mechanism 11.

Figure 23:
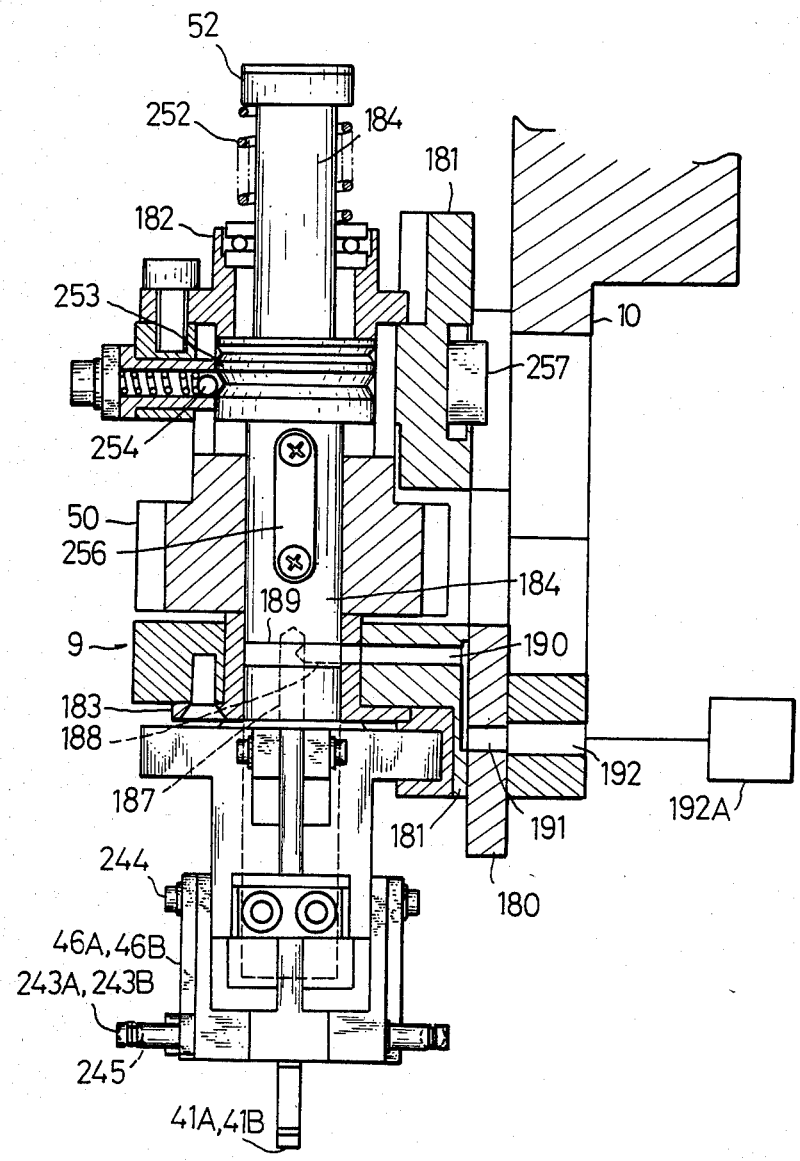
FIG. 23 is a sectional side elevational view of a mounting head.
Figure 24:
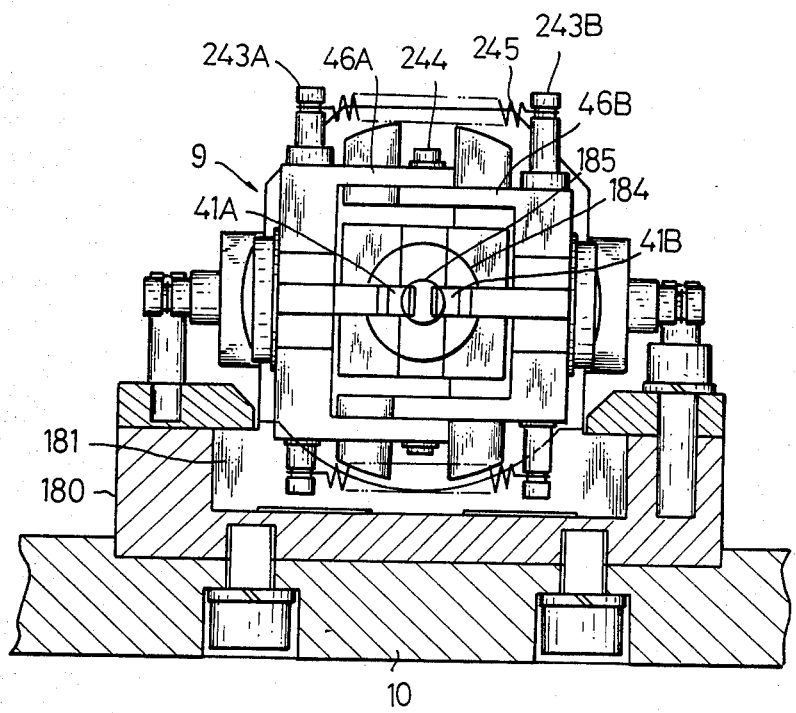
FIG. 24 is a bottom plan view of the mounting head.

Referring to this Figure, an indexing disc 10 is supported by a vertical frame 16. Eight mounting heads 9 are arranged radially on the front surface of the indexing disc 10 at 45° intervals. Each mounting head 9, therefore, is moved past the stations A, B, C, D, E, F, G and H as the indexing disc 10 rotates intermittently. A head actuator mechanism 51A having a depression lever 51 is mounted on the front side of the frame 16 for actuating the mounting head 9 positioned at station E. FIGS. 22 through 24 show the detail of the mounting head 9. Referring to these Figures, an attaching member 180 is fixed to the indexing disc 10. The attaching member 180 is provided with a slide block 181 which is slidable in the radial direction of the indexing disc 10. Bearing members 182 and 183 are fixed to the slide block 181. The bearing members 182, 183 support a mounting head shaft 184 in such a manner as to permit the mounting head shaft 184 to rotate and slide in the radial direction of the indexing disc 10. An end member 185 is fixed to the end of the mounting head shaft 184. A suction pin 48 is attached to the end surface of the end member 185. The suction pin 48 is biased by a compression spring (not shown) to project outwardly from the end member 185. An axial suction hole 187 is formed in the mounting head shaft 184 along the axis of the latter. The axial suction hole 187 opens in the opening formed in the end of the suction pin 48 and extends to an intermediate portion of the head mounting shaft 184. A radial suction hole 188 is formed to communicate with the axial suction hole 187. Furthermore, an annular suction groove 189 is formed in the outer periphery of the mounting head shaft 184, in communication with the suction hole 188. On the other hand, suction holes 190, 191 and 192 are formed in the slide block 181, attaching member 180 and the indexing disc 10, respectively. The arrangement is such that, when the mounting head shaft 184 is in the retracted position, i.e. when the suction pin 48 is not projecting, the suction hole 190 is aligned with the suction groove 189, so that a vacuum is transmitted from a vacuum source 192A through a pipe connected to the suction hole 192, whereby the chip type circuit element 8 is drawn and held by the end of the suction pin 48. On the other hand, a pair of gripping members 41A and 41B are pivotally secured through pins 241A, 241B to a gripping member attaching block 246 which is adapted to engage with and slide together with the slide block 181 and to fit the mounting head shaft 184 to rotate as a unit with the latter. The gripping members 41A and 41B are adapted to cooperate with each other in gripping the chip type circuit element at their ends. Links 46A and 46B are pivoted to the intermediate portions of the gripping members 41A, 41B by means of pins 243A and 243B. The other ends of the links 46A and 46B are pivotally secured to the mounting head shaft 184 by means of the pin 244. A tension spring 245 is stretched between the pins 243A and 243B to bias the gripping members 41A, 41B in such a direction that the ends of these members approach each other. When the mounting head shaft 184 projects with respect to the slide block 181, the gripping members 41A and 41B open as shown in FIG. 26 to permit the suction pin 48 to project.

Tension springs 250A, 250B are provided between the slide block 181 and the attaching member 180 to keep the slide block 181 in the retracted position. A compression spring 252 loaded between the head portion 52 of the mounting head shaft 184 and the bearing member 182 is adapted to keep the mounting head shaft 184 in the retracted position. An engaging member 253 formed on the outer peripheral surface of the mounting head shaft 184 integrally with the latter engages with a ball 254 of the same side as the slide block 181, so as to temporarily retain the mounting head shaft 184 at a retracted first position and at a projected or advanced second position. A mounting orientation changing gear 50 is keyed to the mounting head shaft 184 by means of a key 256 so as to be able to rotate as a unit with the mounting head shaft 184 and slide along the same in the axial direction. A stopper 257 is provided on the bottom surface of the slide block 181 so as to limit the stroke of the slide block 181.

FIG. 25 shows a mounting orientation changing mechanism for changing the orientation of the chip type circuit element to be mounted. Referring to this Figure, a rotary drive gear 291 adapted to engage with the mounting orientation changing gear 50 of each mounting head 9 is supported by the indexing disc 10. A driven member 293 having a roller 292 is fixed to the rotary drive gear 291. On the other hand, a reciprocatory rotational shaft 294 is supported rotatably by the portion of the frame 16 behind the indexing disc 10 through a bearing 295. A driving arm 296 fixed to this shaft 294 makes a reciprocatory rotational motion over a predetermined angle as indicated by an arrow $H_1$. An end lever 297 is pivotally secured by a pin 298 to the end of the driving arm 296. A cylinder 300 is connected between the rear end of the end lever 297 and the cylinder attaching member 299 fixed to the reciprocatory rotational shaft 294. The change of the mounting orientation is performed when the cylinder 300 is in the retracted position as indicated by full line in FIG. 25. In this state, the end of the end lever 297 is held in contact with the roller 292 of the driven member 293, and is moved to the position shown by dot-and-dash line $J_1$ in accordance with the rotation of the driving arm 296 to rotate the rotary driving gear 291 through a substantially 90° angle. It will be seen that, if the rotary driving gear 291 is made to have an equal diameter to the mounting orientation changing gear 50 on the mounting head 9, it is possible to rotate the mounting head shaft 184 by 90°. As a result, the suction pin 48 and the gripping members 41A, 41B rotate 90°, respectively, so that the mounting orientation of the chip type circuit element 8 can be changed with respect to the circuit board 7. On the other hand, if the cylinder 300 is in the expanded state, the end of the end lever 297 takes the position of the dot and dash line $K_1$, so that the end of the end lever 297 does not contact the driving member 293 even though the driving arm 296 is rotated. The mounting orientation, therefore, is not changed.

Figure 27:
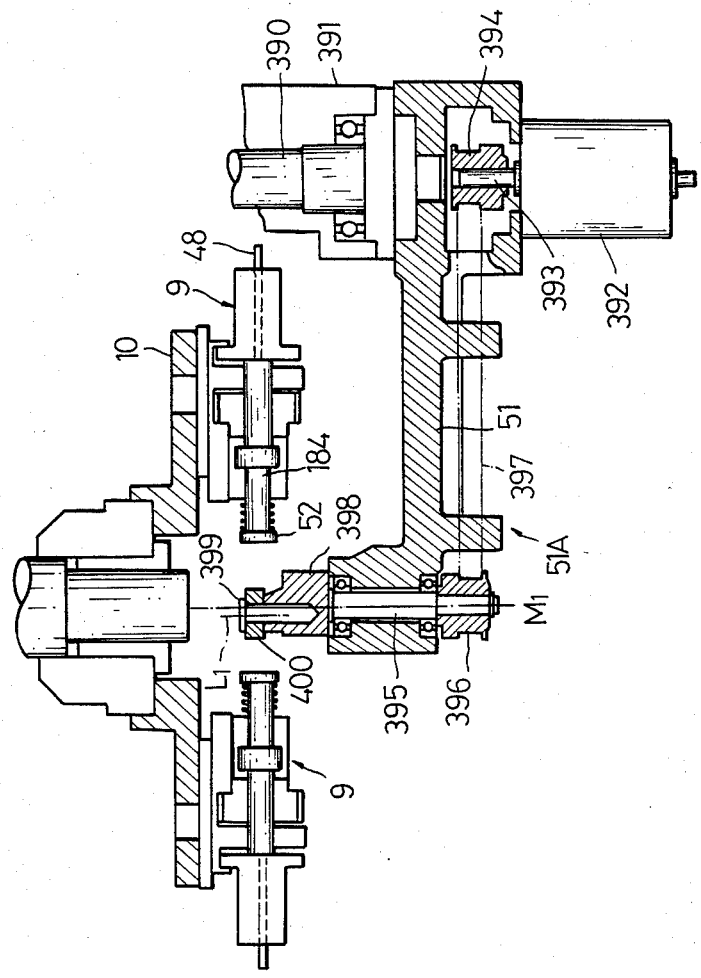
FIG. 27 is a sectional plan view showing the detail of a mechanism for actuating the mounting head.

FIGS. 27 and 28 show the detail of the head actuating mechanism 51A for driving the mounting head 9 situated at station E in FIG. 19. Referring to these Figures, a depressing lever 51 is fixed to a rotary sleeve 391 which is rotatably mounted around a support shaft 390 projecting from the frame 16, and is adapted to rotate in accordance with the rotation of the rotary sleeve 391. A rotary cylinder 392 is fixed to the supporting-side end of the depression lever 51. The rotary cylinder 392 has a cylinder shaft 393 which is rotatable over an angular range of between about 0° and 180°. A pulley 394 is fixed to the cylinder shaft 393. A rotary shaft 395 is rotatably supported by the end of the depression lever 51 and a pulley 396 is fixed to one end of the rotary shaft 395. A belt 397 is stretched between the pulleys 394 and 396. A roller attaching block 398 is fixed to the other end of the rotary shaft 395. An operation roller 400 is secured to the roller attaching block 398 by means of a pin 399. The roller 400 has a center $L_1$ which is offset from the axis $M_1$ of the rotary shaft 395. Consequently, the rotation of the rotary cylinder 392 is transmitted to the roller attaching block 398 through the pulley 394, belt 397, pulley 396 and the rotary shaft 395. As the roller attaching block 398 makes a half rotation (180°), the operation roller 400 is moved from the lowermost normal operative position shown in FIG. 29 to an uppermost idle position shown in FIG. 30. The mounting head 9 is moved successively past the stations A, B, C, D, E, F, G and H in accordance with the rotation of the indexing disc 10. The mounting head 9 receives the chip type circuit element 8 when it takes an upward posture, i.e. when it is located at station A. At this position, the head 52 of the mounting head shaft 184 of the mount head 9 is pressed by a cam mechanism (not shown) or the like so that the slide block 181 assumes the fully projected position. At the same time, the mounting head shaft 184 is slightly projected from the slide block 184. More particularly, the gripping members 41A and 41B are slightly opened and, in this state, the chip type circuit element 8 is fed into the space between the gripping members 41A, 41B by the shifting mechanism shown in FIG. 6. Thereafter, the slide block 181 and the mounting head shaft 184 are returned to the retracted positions. Then, while the chip type circuit element 8 is gripped by the gripping members 41A and 41B and drawn by the suction pin 48, the mounting head 9 is moved to the station B in accordance with the rotation of the indexing disc 10. At station B, the positioning of the chip type circuit element is conducted by the operation of the aforementioned positioning mechanism 160. The change of the mounting orientation of the chip type electronic part 8 by the mounting orientation changing mechanism is conducted when the mounting head 9 is positioned at station C. The cylinder 300 is contracted to transmit the rotation of the driving arm 296 to the driven member 293 through the end lever 297 only when a change of orientation is necessitated. As a result, the mounting head shaft 184 is rotated by 90° followed by the 90° rotation of the suction pin 48 and gripping members 41A, 41B. It is to be noted here that the cylinder 300 performs selectively depending on whether a change of the mounting orientation is to be conducted or not, and the driven member 293 is driven by the driving arm 296 which continuously undergoes the reciprocatory rotary motion. According to the described embodiment, therefore, it is possible to remarkably increase the speed of operation as compared with the case where the rotary drive gear 291 is directly driven by the cylinder of the motor. For the same reason, the described embodiment permits an easier synchronization of operation with the operation of another mechanism.

At station D, a known detection means detects whether the mounting head 9 is holding the chip type circuit element 8 in preparation for the mounting operation which is to be conducted at the next station E. When the mounting head 9 takes a downward posture, i.e. when it is positioned at station E, the operation roller 400 of the head actuating mechanism 51A takes the normal operating position shown in FIG. 29, provided that the mounting head 9 holds a chip type circuit element 8. In consequence, the head portion 52 of the mounting head shaft 184 is brought into contact with the operation roller 400 by the rotation of the depression lever 51 in the direction of the arrow B₁, and the mounting head shaft 184 is depressed over a sufficiently large stroke. Consequently, the slide block 181 and the mounting head shaft 184 are projected or lowered by a predetermined amount due to the mutual engagement between the ball 254 and the engaging member 253. Then, after the slide block 181 is moved to the lowermost position in its stroke, the mounting head shaft 184 alone is further lowered so that the relation between the ball 254 and the engaging member 253 is shifted from the retracted first position to the second position where the mounting head shaft 184 is projected. In consequence, the gripping members 41A and 41B are moved apart by the operation of the links 46A and 46B and, at the same time, the suction pin 48 is projected to deliver the chip type circuit element 8 onto the circuit board 7. When the mounting head shaft 184 takes the lowermost position, the suction groove 189 in the peripheral surface of the mounting head shaft 184 is completely out of alignment with the suction hole 190 of the slide block 181. Therefore, the suction pin 48 releases the chip type circuit element 8 soon after the delivery to the circuit board 7, and is reset to the retracted position. To the contrary, when no chip type circuit element is detected on the mounting head, the rotary cylinder 392 of the actuating mechanism 51A is started so that the operation roller 400 is moved to the uppermost position shown in FIG. 30. Therefore, the downward stroke of the mounting head shaft 184 caused by the rotation of the depression lever 51 is diminished and, hence, the suction pin 48 cannot be lowered sufficiently. It is, therefore, possible to eliminate any trouble attributable to the direct contact of the suction pin 48 with the adhesive on the circuit board 7. It is possible to use a pulse motor in place of the rotary cylinder 392 of the head actuating mechanism 51A.

If it is desired to rotate the mounting head 9 by 90° to reset the same to the starting position, the change of orientation is made at station G shown in FIG. 19 by a mechanism similar to that shown in FIG. 25.

The embodiment heretofore described offers the following advantages.

The mounting head 9 is provided with a pair of gripping members 41A, 41B in addition to the suction pin 48. In operation, the chip type circuit element 8 is mechanically gripped by these gripping members 41A, 41B. Accordingly, it is possible to stably hold the chip type circuit element against vibration or the like and the rotation speed of the indexing disc 10 and, hence, the mounting speed can be increased considerably.

Since the mounting of the chip type circuit element onto the circuit board 7 is performed by the elongated suction pin 48, the mounting can be made without the possibility of failure even when the room for mounting is limited as in the case where the mounting of the element is made after loading of other electronic parts.

In the mounting orientation changing mechanism, the rotary driving force is not derived directly from a prime mover such as a cylinder or a motor. The cylinder 300 makes only a selection as to whether the change of the mounting orientation is to be effected or not, and the rotary driving power is produced by the driving arm 296 which has a continuous reciprocatory rotational movement. It is therefore, possible to increase the orientation changing operation. For the same reason, it is easy to obtain a matching or synchronism with the operation of another mechanism.

The depression lever 51 of the head actuating mechanism 51A is provided with the operation roller 400 being eccentrically mounted, and the depression stroke of the mounting head shaft 184 is varied by changing the extent of eccentricity of the operation roller 400. Thus, the amount of depression of the mounting head 184 is minimized when the mounting head 9 does not hold the chip type circuit element 8 to keep the suction pin 48 away from the adhesive which is previously applied to the circuit board 7, so that any trouble attributable to the deposition of the adhesive on the suction pin 48 is eliminated advantageously.

As has been described, according to this embodiment, it is possible to attain higher speeds of shifting and mounting, as well as improved reliability, thanks to the arrangement in which the chip type circuit element is gripped and shifted mechanically. In addition, the change of mounting orientation is made at a high speed by the mounting orientation changing mechanism. Furthermore, when the mounting head does not hold the chip type circuit element, an idle operation exists to prevent any trouble attributable to deposition of adhesive to the suction pin.

Printed Circuit Board Supply Unit

Referring now to FIGS. 31 through 34, the construction of a supply unit for supplying printed circuit boards onto the X-Y table suitable for use in combination with the apparatus of the present invention will be described.

Figure 31:
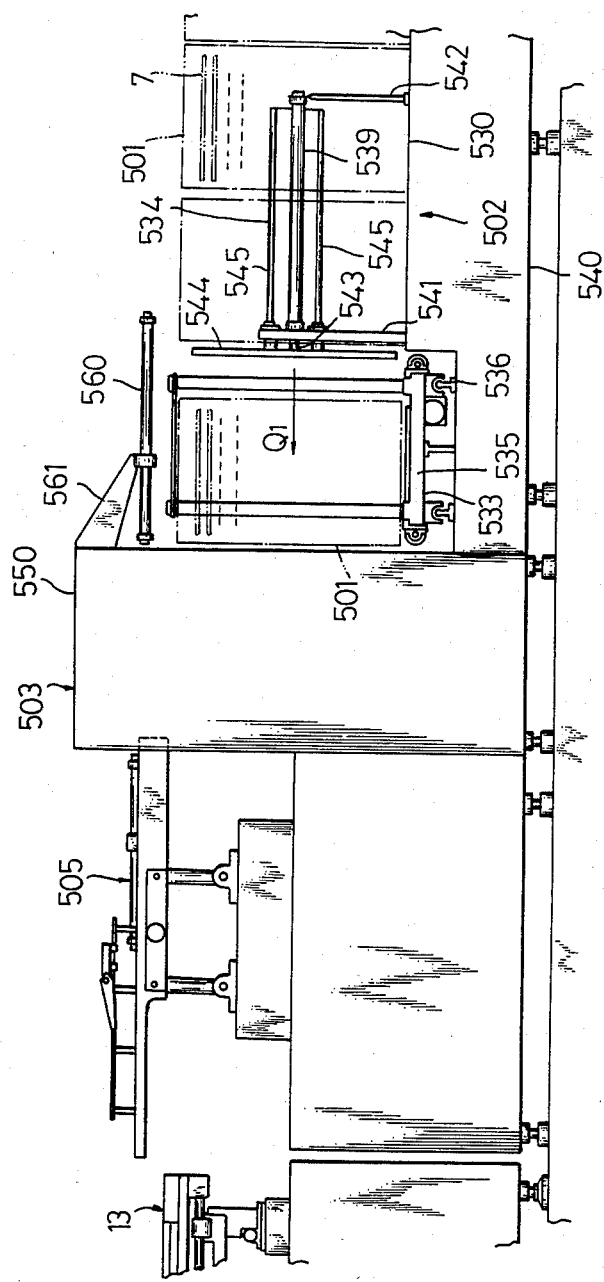
FIG. 31 is a side elevational view of an embodiment of a printed circuit board supplying apparatus for use in combination with the mounting apparatus in accordance with the invention.
Figure 32:
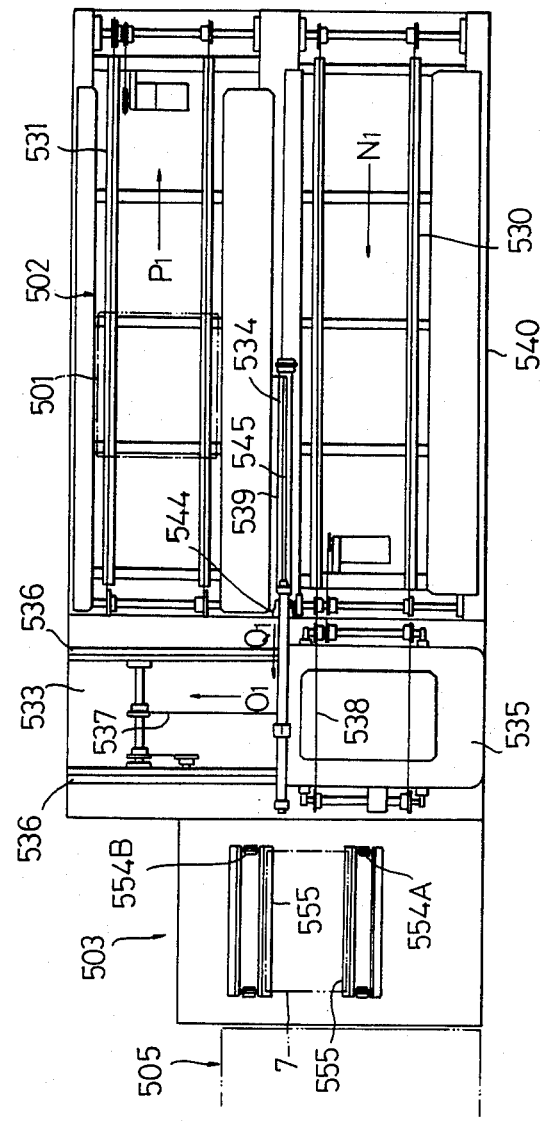
FIG. 32 is a plan view of the apparatus shown in FIG. 31.

FIGS. 31 and 32 show the overall construction of this embodiment, in this state in which printed circuit boards 7 are delivered to the X-Y table 13 of the automatic mounting apparatus for mounting chip type circuit elements onto the printed circuit boards. Referring to these Figures, the printed circuit board supply unit has a circuit board magazine conveyor 502 and a circuit board elevator 503. The circuit board magazine conveyor 502 is adapted to convey circuit board magazines 501 each containing printed circuit boards 7 stacked in layers, along a substantially U-shaped path in the direction of arrows $N_1$, $O_1$ and then $P_1$. The circuit board elevator 503 comprises a lifting gear. A circuit board conveyor 505 is disposed as desired between the circuit board elevator 503 and the X-Y table 13 of the automatic mounting apparatus.

Figure 33:
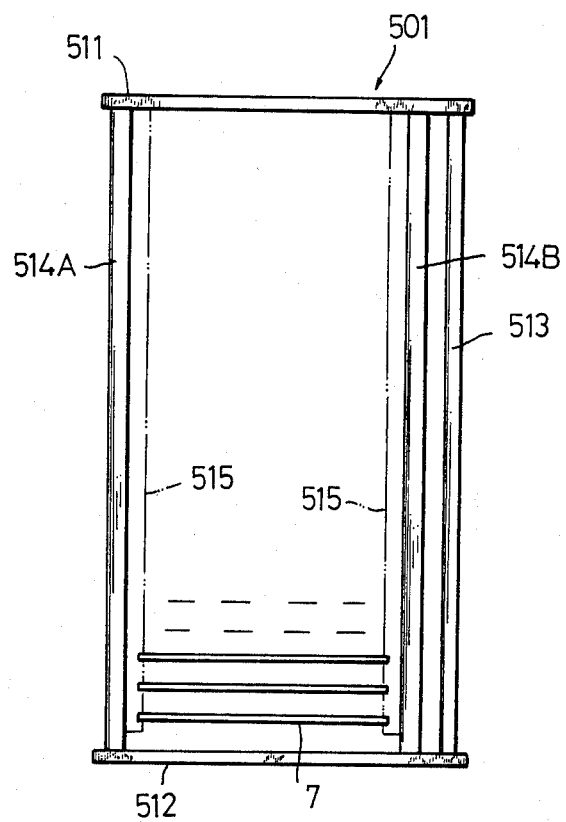
FIG. 33 is a front elevational view of a circuit board magazine.

As will be understood from FIG. 33, the circuit board magazine 501 includes a box-shaped frame constituted by an upper plate 511 and the lower plate 512 interconnected by a supporting frame 513. Guide attaching bars 514A and 514B are secured between the upper plate 511 and the lower plate 512. A circuit board holding guide 515 is fixed to the guide attaching bars 514A, 514B. The circuit board holding guide 515 is provided with a multiplicity of grooves formed at a predetermined pitch so as to engage with the side edges of the printed circuit board 7. A multiplicity of printed circuit boards 7 are supported at a constant pitch by the circuit board holding guides 515.

The circuit board magazine conveyor 502 includes an inlet chain conveyor 530 for transferring the circuit board magazine 501 in the direction of an arrow $N_1$, an outlet conveyor 531 parallel with the inlet conveyor 530 and adapted for transferring circuit board magazine 501 in the direction indicated by an arrow $P_1$, an intermediate conveyor 533 for interconnecting the inlet and outlet chain conveyors 530, 531, and a pusher mechanism 534. The intermediate conveyor 533 has a magazine mount 535 for mounting the circuit board magazine 501. The magazine mount 535 is slidably carried by a slide rail 536 and is adapted to be moved by a chain 537. The magazine mount 535 is also provided with a chain conveyor 538. A pusher mechanism 534 has a pneumatic cylinder 539 as a pusher attached to the base 540 of the circuit board magazine conveyor 502 through the medium of supporting members 541, 542. A circuit board pressing member 544 is fixed to the rod 543 of the pneumatic cylinder 539. An auxiliary guide shaft 545 extending through the supporting member 541 is fixed to the circuit board pressing member 544. This auxiliary guide shaft 545 is adapted to prevent the inclination of the circuit board pressing member 544 thereby to ensure a smooth parallel movement the same. The circuit board pressing member 544 has such a vertical length that it can contact both of the printed circuit board 7 of the uppermost stage and the printed circuit board 7 of the lowermost stage in the circuit board magazine simultaneously.

Figure 34:
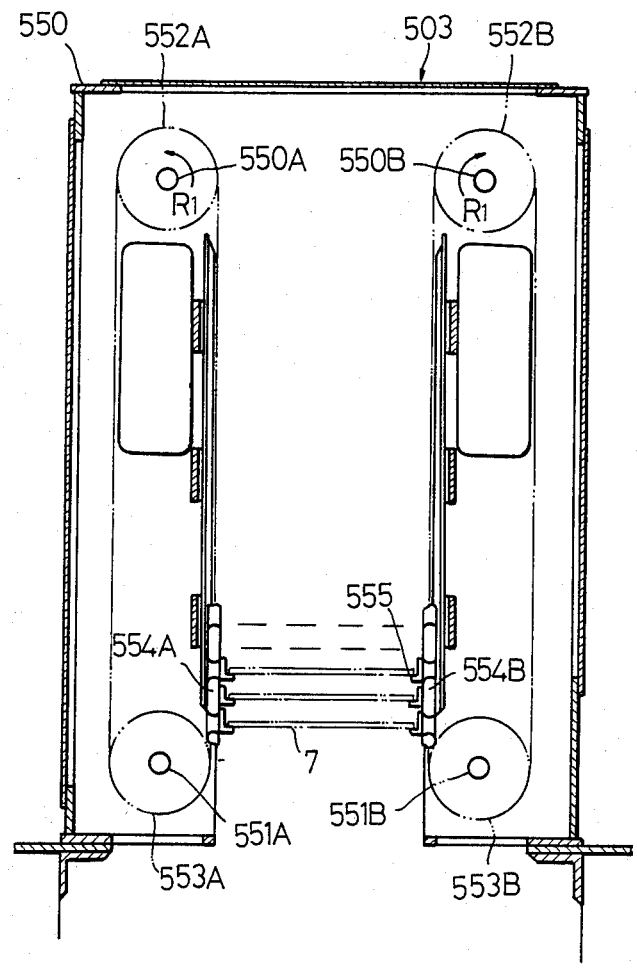
FIG. 34 is a front elevational view of a circuit board elevator.

As shown in FIG. 34, the circuit board elevator 503 has an elevator frame 550 by which a pair of drive shafts 550A, 550B and a pair of rotary shafts 551A, 551B are supported. Sprockets 552A, 552B are fixed to the drive shafts 550A, 550B while sprockets 553A, 553B are fixed to the rotary shafts 551A, 551B. Chains 554A and 554B are stretched between the sprockets 552A and 553A and between the sprockets 552B and 553B. Substrate retainers 555 for retaining the printed circuit boards 7 are attached to each of the chains 554A and 554B at a constant pitch. The pitch of the retainers 555 is so determined that the supporting distance of the printed circuit board 7 coincides with the span of supporting of the circuit board by the circuit board magazine 501. A pusher 560 is fixed to the elevator frame 550 through the medium of an attaching member 561. The pusher is constituted by a pneumatic cylinder adapted to push out only the printed circuit board 7 of the uppermost stage in the circuit board elevator 503 onto the circuit board conveyor 505. The circuit board conveyor 505, which is a conveyor belt, is adapted to feed the printed circuit board 7 one by one onto the X-Y table 13.

In operation, the circuit board magazine 501 accommodating a multiplicity of printed circuit boards 7 is moved by the inlet conveyor 530 in the direction of the arrow $N_1$ and is then fed to the magazine mount 535 of the intermediate conveyor 533 stationed at the end of the inlet conveyor 530. The circuit board magazine 501 on the magazine mount 535 is stopped after moving to a predetermined position by the chain conveyor 538 of the magazine mount 535. After the positioning of the circuit board magazine 501 on the magazine mount 535, the magazine mount 535 is pulled by the chain 537 and is moved as indicated by an arrow $O_1$ and is then stopped at a position just in front of the circuit board elevator 503. In this state, the side edges of the printed circuit board 7 in the circuit board magazine 501 are engageable with the retainers 555 on the circuit board elevator 503. The pusher mechanism 534 operates in this state to move the circuit board pusher 544 ahead as indicated by an arrow $Q_1$ to force all printed circuit boards 7 onto the circuit board elevator 503. The printed circuit board 7 of the uppermost one of the circuit boards stacked in stages on the circuit board elevator 7 is then forced out to the circuit board conveyor 505 by means of the pusher 560. Thereafter, the drive shaft 550A, 550B of the circuit board elevator 503 are rotated as indicated by an arrow $R_1$ to lift the printed circuit boards 7 to raise the next circuit board 7 to the level of the uppermost stage which is contacted by the pusher 560. Then, the next printed circuit board 7 is pushed onto the circuit board conveyor 505 by the operation of the pusher 560. Thereafter, the operation of the pusher 560 and the circuit board elevator 503 is repeated until all of the printed circuit boards 7 are forced out from the circuit board elevator 503.

The vacant circuit board magazine 501 is sent to the end of the outlet chain conveyor 531 by the movement of the magazine mount 535 and is fed into the outlet conveyor 531 to move in the direction of the arrow $P_1$ to be discharged. The vacant circuit board elevator 503 is loaded with new printed circuit boards 7 coming from the next circuit board magazine 501.

According to the illustrated embodiment, since the printed circuit boards are stacked in stages in the circuit board magazine 501, it is possible to convey a multiplicity of printed circuit boards 7 as a unit by transferring the circuit board magazine 501. It is, therefore, possible to conduct various operations such as supply, discharge and exchange of the printed circuit boards with an exceedingly high efficiency. The use of the circuit board magazine conveyor 502 adapted to convey the circuit board magazines 501 along a substantially U-shaped path permits the pusher mechanism 534 to move between the inlet and outlet conveyors 530 and 531, which in turn makes it possible to transfer all printed circuit boards 7 in the magazine to the circuit board elevator 503 at one time thereby to ensure a higher speed of supply of the printed circuit boards.

Various types of conveyor mechanisms capable of conveying the printed circuit boards in a one-by-one fashion can be used as the circuit board conveyor 505.

As has been described, according to this embodiment, it is possible to obtain a printed circuit board supply unit in which a multiplicity of printed circuit boards are stacked in stages within the circuit board magazine and the circuit boards stacked in stages within the magazine is delivered at once to the circuit board elevator which in turn moves upward to supply the circuit boards in a one-by-one fashion, thereby to perform the supply of the printed circuit boards at a high efficiency.

It is, therefore, possible to carry out a highly efficient mounting operation for mounting chip type circuit elements, by using this printed circuit board supply unit in combination with the chip type circuit element mounting apparatus of the invention.

Obviously, numerous modifications and variations of the present invention are possible in the light of the above teachings. It is therefore to be understood that within the scope of the claims hereof the invention may be practiced otherwise than as specifically disclosed herein.

What is claimed is:

1. Apparatus for mounting chip type circuit elements on printed circuit boards, comprising:
   supply unit means for supplying chip type circuit elements;
   a plurality of pallets and means for conveying said pallets in an intermittent fashion in a particular direction;
   first shifting means for shifting said chip type circuit elements from said supply unit means onto said pallets;
   an X-Y table carrying said printed circuit boards thereon;
   mounting means including at least one mounting head for mounting said chip type circuit elements on a printed circuit board carried by said X-Y table; and
   second shifting means for shifting said chip type circuit elements from said pallets to said at least one mounting head;
   wherein each of said pallets have circuit element gripping means for mechanically receiving and gripping said chip type circuit elements; and
   wherein said at least one mounting head has circuit element gripping means for mechanically receiving and gripping said chip type circuit elements;
   so that said chip type circuit element supplied by said supply unit means is positively gripped mechanically until it is mounted on said printed circuit board.

2. The combination of claim 1, wherein each of said pallets includes a base, a pair of gripping bars mounted on said base for parallel movement and constituting said chip type circuit element gripping means, spring means for biasing said gripping bars towards each other, and a push rod slidably disposed in the space between said pair of gripping bars.

3. The combination of claim 2, wherein said conveying means includes an endless belt means having a chain conveyor running in a substantially horizontal plane, said pallets being secured to the outer periphery of said chain conveyor at a constant pitch.

4. The combination of claim 1, wherein said supply unit means includes a part feeder having a vibration table for feeding said chip type circuit elements to a supply port formed at the front end thereof, and a conveyor belt for returning a portion of said chip type circuit elements dropped from said part feeder back to the upstream end of said vibration table.

5. The combination of claim 4, wherein said part feeder includes a shield plate defining an air blowing space proximate to said vibration table and an air blower pipe for supplying an air flow to said air blowing space in the direction of feed of said chip type circuit elements.

6. The combination of claim 4, wherein said supply unit means further includes an actuator disposed above said vibration table of said part feeder and contactable with said chip type circuit element moving on said vibration table, a switch actuatable by said actuator and a detection circuit for producing an output signal upon detecting that said actuator is kept out of contact with said chip type circuit element for a predetermined period of time.

7. The combination of claim 1, wherein said mounting means comprises an indexing member for rotating intermittently, and a plurality of mounting heads provided on said indexing member, each of said mounting heads having a rotatable and slidable mounting head shaft driven axially by a driving member when said mounting head takes a predetermined position, a suction pin provided on one end of said mounting head shaft for drawing and holding said chip type circuit element and a pair of gripping members for gripping said chip type circuit element.

8. The combination of claim 1, wherein said mounting means comprises an indexing member for rotating intermittently, a plurality of mounting heads provided on said indexing member and a mounting orientation changing mechanism for changing the orientation of mounting of said chip type circuit elements on said mounting heads,
   each of said mounting heads having a rotatable and slidable mounting head shaft driven axially by a driving member when said mounting head takes a predetermined position, a suction pin provided on one end of said mounting head shaft for drawing and holding said chip type circuit element, a pair of gripping members rotatable together with said mounting head shaft for gripping said chip type circuit element therebetween, and a mounting orientation changing gear rotatable as a unit with said mounting head shaft,
   said mounting orientation changing mechanism including a rotary driving gear meshing with said mounting orientation changing gear, a driven member fixed to said rotary driving gear, a driving arm for effecting a reciprocatory motion, an end lever pivotally secured to the end of said driving arm, and a cylinder for setting said end lever from a position not contactable with said driven member to an operative position contactable with said driven member.

9. The combination of claim 1, wherein said mounting means comprises an indexing member for rotating intermittently, a plurality of mounting heads provided on said indexing member and a head actuating mechanism for actuating each of said mounting heads upon the latter obtaining a predetermined position,
   wherein said mounting heads each include a slidable mounting head shaft axially actuatable by said head actuating mechanism, a suction pin provided on the end of said mounting head shaft for drawing and holding said chip type circuit element and a pair of gripping members for gripping said chip type circuit element therebetween, and
   wherein said head actuating mechanism includes an actuating member rotatable in a direction for axially pressing said mounting head shaft of said mounting head upon the latter obtaining a predetermined position, a rotary shaft supported by said actuating member and an operation roller provided at an eccentricity with respect to said rotary shaft, whereby, when said mounting head at said predetermined position does not hold said chip type circuit element, said rotary shaft rotates to offset said operation roller to a position not contactable with said mounting head shaft or to a position for reducing the displacement of said mounting head shaft.

10. The combination of claim 1, wherein said supply unit means includes a part feeder and wherein said first shifting means comprises a chip force-out slider having a notch engageable with said chip type circuit element and reciprocatingly movable in back and forth directions,
- a chip push-up slider which becomes, when taking a lowered position, flush with a bottom surface of said part feeder to receive said chip type circuit element from said part feeder and to bring said chip type circuit element into engagement with said notch when taking a raised position, and
- a chip pressing member for pressing the upper surface of said chip type circuit element on said chip push-up slider.

11. The combination of claim 1, wherein said supply unit means includes a part feeder and wherein said first shifting means comprises a chip force-out slider having a notch engageable with said chip type circuit element and slidable back and forth,
- a chip push-up slider becoming, when taking a lowered position, flush with a bottom surface of said part feeder to receive said chip type circuit element from said part feeder and to bring said chip type circuit element into engagement with said notch when taking a raised position,
- a first lever and a second lever for actuating said force-out slider, and
- a third lever and a fourth lever for actuating said chip push-up slider,
- said first and third levers reciprocatingly moved continuously while said second and fourth levers hold said force-out slider and said push-up slider in the rectracted position and in the lowered position respectively, when the shifting of said chip type circuit element is not conducted.

12. The combination of claim 3, wherein said second shifting means includes a push-out member for contacting a push rod of said pallet and for driving said push rod in the direction of feed of said chip type circuit element when said pallet is stopped at a predetermined position,
- a supporting member positioned above said pallet, and
- a guide member secured to said supporting member for pressing the upper surface of said chip type circuit element.

13. The combination of claim 1, further including means for positioning the chip type circuit element as the same is gripped and held on said mounting head of said mounting means,
said positioning means including a slide shaft slidably provided on a supporting block,
- a pair of Y-direction positioning levers pivotally secured to said supporting block and driven in a closing direction as said slide shaft is lowered,
- Y-direction positioning claws secured to said positioning levers, and
- a push pin supported by the lower end of said slide shaft so as to resiliently project therefrom,
- said chip type circuit element being gripped at side surfaces thereof by said positioning claws while being pressed at its upper surface by said push pin.

14. The combination of claim 1, further including printed circuit board supply means for conveying printed circuit boards onto said X-Y table, said printed circuit board supply means comprising
- a printed circuit board magazine for accommodating a plurality of printed circuit boards at a predetermined pitch,
- a printed circuit board magazine conveyor for conveying said magazine,
- a printed circuit board elevator movable up and down and for supporting said printed circuit boards at the same pitch as said printed circuit board magazine, and
- a pusher mechanism for transferring all printed circuit boards in said magazine on said magazine conveyor to said elevator at once.

15. The combination of claim 14, wherein said printed circuit board magazine conveyor includes an inlet conveyor, an outlet conveyor parallel with said inlet conveyor and an intermediate conveyor connected between said inlet conveyor and said outlet conveyor, said pusher mechanism being disposed between said inlet conveyor and said outlet conveyor.

16. The combination of claim 2, wherein said mounting means comprises an indexing member for rotating intermittently and a plurality of mounting heads provided on said indexing member,
- each of said mounting heads having a rotatable and slidable mounting head shaft driven axially by a driving member when said mounting head takes a predetermined position,
- a suction pin provided on one end of said mounting head shaft and for drawing and holding said chip type circuit element, and
- a pair of gripping members for gripping said chip type circuit element.

17. The combination of claim 16, further including means for positioning the chip type circuit element as the same is gripped and held on said mounting head of said mounting means, said positioning means including a slide shaft slidably provided on a supporting block,
- a pair of Y-direction positioning levers pivotally secured to said supporting block and driven in a closing direction as said slide shaft is lowered,
- Y-direction positioning claws secured to said Y-direction positioning levers, and
- a push pin supported by the lower end of said slide shaft so as to resiliently project therefrom,
- said chip type circuit element being gripped at side surfaces thereof by said positioning claws while being pressed at its upper surface by said push pin.

* * * * *